US012628297B2

(12) United States Patent
Shim et al.

(10) Patent No.: US 12,628,297 B2
(45) Date of Patent: May 12, 2026

(54) WINDOW MEMBER AND APPARATUS FOR MANUFACTURING THE SAME, AND METHOD FOR MANUFACTURING THE SAME

(71) Applicant: SAMSUNG DISPLAY CO., LTD., Yongin-si (KR)

(72) Inventors: Byoung Yul Shim, Yongin-si (KR); Beom Gyu Choi, Yongin-si (KR); Jin Soo Shin, Yongin-si (KR); Hyun Hee Lee, Yongin-si (KR); Seung Pyo Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 279 days.

(21) Appl. No.: 18/331,303

(22) Filed: Jun. 8, 2023

(65) Prior Publication Data

US 2024/0114640 A1     Apr. 4, 2024

(30) Foreign Application Priority Data

Sep. 30, 2022     (KR) ........................ 10-2022-0125209

(51) Int. Cl.
| | |
|---|---|
| *H05K 5/03* | (2006.01) |
| *C03B 23/03* | (2006.01) |
| *H10K 59/12* | (2023.01) |

(52) U.S. Cl.
CPC .............. *H05K 5/03* (2013.01); *C03B 23/03* (2013.01); *C03B 2215/40* (2013.01); *H10K 59/12* (2023.02)

(58) Field of Classification Search
CPC . C03B 2215/40; C03B 23/03; C03B 23/0302; C03B 23/0307; H05K 5/03; H10K 59/12; H10K 59/40; H10K 59/872
See application file for complete search history.

(56) References Cited

FOREIGN PATENT DOCUMENTS

| | | |
|---|---|---|
| CN | 106810059 | 6/2017 |
| JP | 2004-083352 | 3/2004 |
| KR | 10-2020-0131365 | 11/2020 |

*Primary Examiner* — Lawrence D Ferguson
(74) *Attorney, Agent, or Firm* — F. CHAU & ASSOCIATES, LLC

(57) ABSTRACT

A window member includes a main part including a first side extending in a first direction, a second side extending in a second direction, and a first corner side connecting the first and second sides. The window member further includes a first side part in contact with the first side, a second side part in contact with the second side, and a first corner part connecting the first and second side parts. The first corner part includes a first upper corner part, a first middle corner part, and a first lower corner part. A lower surface of the first middle corner part has a first radius of curvature, a lower surface of the first lower corner part has a second radius of curvature, and the first radius of curvature is greater than the second radius of curvature.

14 Claims, 28 Drawing Sheets

TA1: UA_TA1, MA_TA1, LA_TA1
TA2: UA_TA2, MA_TA2, LA_TA2
TA3: UA_TA3, MA_TA3, LA_TA3
TA4: UA_TA4, MA_TA4, LA_TA4
ETA1: UA_ETA1, MA_ETA1, LA_ETA1
ETA2: UA_ETA2, MA_ETA2, LA_ETA2
ETA3: UA_ETA3, MA_ETA3, LA_ETA3
ETA4: UA_ETA4, MA_ETA4, LA_ETA4

UA_ETA1: TS_UA_ETA1, BS_UA_ETA1
MA_ETA1: TS_MA_ETA1,BS_MA_ETA1
LA_ETA1: TS_LA_ETA1, BS_LA_ETA1

170

150

130

110

WINDOW MEMBER AND APPARATUS FOR MANUFACTURING THE SAME, AND METHOD FOR MANUFACTURING THE SAME

CROSS-REFERENCE TO RELATED APPLICATION

This application claims priority from Korean Patent Application No. 10-2022-0125209, filed on Sep. 30, 2022, in the Korean Intellectual Property Office, and all the benefits accruing therefrom under 35 U.S.C. 119, the contents of which in its entirety are herein incorporated by reference.

BACKGROUND

1. Technical Field

One or more embodiments described herein relate to a window member, an apparatus for manufacturing the same, and a method for manufacturing the same.

2. Description of the Related Art

Interest in display devices has increased with the development of multimedia. Such display devices include liquid crystal displays (LCDs), organic light emitting displays (OLEDs), and the like. Among them, the organic light emitting displays (OLEDs) have a wide viewing angle, an excellent contrast, and a fast response speed. Some organic light emitting displays have been designed to have bending characteristics. In some flexible display devices, edge portions of a display area are bent with a predetermined curvature in order to improve aesthetics.

SUMMARY

Aspects of the present disclosure provide a window member capable of at least partially or completely covering a display area of a display device.

Aspects of the present disclosure also provide an apparatus and method for manufacturing a window member capable of reducing or minimizing breakage, buckling, and/or burr occurring at a corner part of the window member.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a window member comprises, a main part including a first side extending in a first direction, a second side extending in a second direction different from the first direction, and a first corner side positioned between the first side and the second side, a first side part in contact with the first side, a second side part in contact with the second side, and a first corner part positioned between the first side part and the second side part, wherein the first corner part includes, a first upper corner part positioned adjacent to the main part, a first middle corner part positioned adjacent to the first upper corner part, and a first lower corner part positioned on a side opposite to the first upper corner part with the first middle corner part interposed therebetween, and a lower surface of the first middle corner part has a first radius of curvature, a lower surface of the first lower corner part has a second radius of curvature, and the first radius of curvature is greater than the second radius of curvature.

In an embodiment, upper surfaces of the first upper corner part, the first middle corner part, and the first lower corner part may have a same curvature.

In an embodiment, the main part may have a first maximum thickness, the first middle corner part may have a second maximum thickness, the first lower corner part may have a third maximum thickness, and the second maximum thickness may be greater than the third maximum thickness.

In an embodiment, the second maximum thickness may be greater than the third maximum thickness by about 0.04 to about 0.2 times the third maximum thickness.

In an embodiment, the second maximum thickness may be greater than the third maximum thickness by about 0.02 mm or more and about 0.1 mm or less.

In an embodiment, the third maximum thickness may be the same as the first maximum thickness.

In an embodiment, a thickness of the first middle corner part may increase from the first upper corner part and the first lower corner part toward a middle portion of the first middle corner part.

In an embodiment, a first height from a lower surface of the main part to one end of the first corner part may be equal to each of a second height from the lower surface of the main part to one end of the first side part and a third height from the lower surface of the main part to one end of the second side part.

According to an aspect of the present disclosure, an apparatus for manufacturing a window member, comprises a first mold and a second mold disposed on the first mold, wherein the first mold includes a lower support part and a lower bending molding part surrounding the lower support part, the lower bending molding part includes, an upper area positioned adjacent to the lower support part, a middle area adjacent to the upper area, and a lower area positioned on a side opposite to the upper area, with the middle area interposed therebetween, and an upper surface of the middle area has a first radius of curvature, an upper surface of the lower area has a second radius of curvature, and the first radius of curvature is greater than the second radius of curvature.

In an embodiment, the second mold may include an upper support part and an upper bending molding part surrounding the upper support part, and a curvature of the upper surface of the lower area may be equal to a curvature of a lower surface of the upper bending molding part.

In an embodiment, the second mold may include an upper support part and an upper bending molding part surrounding the upper support part, in a state in which the first mold and the second mold are coupled to each other. The lower support part and the upper support part may be spaced apart from each other by a first maximum distance. The upper surface of the middle area and a lower surface of the upper bending molding part may be spaced apart from each other by a second maximum distance. The upper surface of the lower area and the lower surface of the upper bending molding part may be spaced apart from each other by a third maximum distance, and the second maximum distance may be greater than the third maximum distance.

In an embodiment, the second maximum distance may be greater than the third maximum distance by about 0.04 to about 0.2 times the third maximum distance.

In an embodiment, the second maximum distance may be greater than the third maximum distance by about 0.02 mm or more and about 0.1 mm or less.

In an embodiment, the third maximum distance may be the same as the first maximum distance.

In an embodiment, coefficients of thermal expansion of the first mold and the second mold may be greater than a coefficient of thermal expansion of the window member which is a manufacturing target.

In an embodiment, the coefficients of thermal expansion of the first mold and the second mold may be about 80×10-7/° C. to about 90×10-7/° C.

In an embodiment, the second mold may include an upper support part and an upper bending molding part surrounding the upper support part, and a distance between the middle area and the upper bending molding part may increase from the upper area and the lower area toward a middle portion of the middle area.

According to an aspect of the present disclosure, a method for manufacturing a window member, comprises preparing a window member before being molded, preparing an apparatus for manufacturing a window member, and heating and compressing the window member before being molded through the apparatus to convert the window member into a bent window member. The window member before being molded includes a main part including a first side extending in a first direction, a second side extending in a second direction different from the first direction, and a first corner side positioned between the first side and the second side, a first side part in contact with the first side, a second side part in contact with the second side, and a first corner part positioned between the first side part and the second side part. A first reference point is spaced apart from a reference center of curvature, which is a center of curvature of the first corner side to one side in the first direction, by a first distance and to one side in the second direction by a second distance. A first point is spaced apart from the first reference point to another side in the first direction by a third distance and a second point spaced apart from the first reference point to another side in the second direction by a fourth distance. An ellipse includes the first distance as a first radius, the second distance as a second radius, and the reference center of curvature as a center. A reference line passes through the reference center of curvature and inclined by a predetermined angle with respect to the first direction. A second reference point corresponds to a location where the ellipse and the reference line meet. A third point is positioned on the reference line and is positioned between the reference center of curvature and the second reference point. The first point overlaps the first side in the second direction and the second point overlaps the second side in the first direction, and the first corner part includes a shape of a spline curve connecting the first point to the third point to each other.

In an embodiment, the third distance may be about 1.8 to about 2.2 times the first distance, the fourth distance may be about 1.2 to about 1.4 times the second distance, and a first reference length may be about 0.85 to about 0.95 times the second reference length, the first reference length being a distance from the reference center of curvature to the third point, and the second reference length being a distance from the reference center of curvature to the second reference point.

In an embodiment, the shape of the spline curve may be a shape of a portion of an ellipse or a circle.

A window member according to an embodiment may completely cover a display area of a display device.

With an apparatus and method for manufacturing a window member according to an embodiment, it is possible to reduce or minimize breakage, buckling, and/or the formation of burrs at a corner part of the window member.

In accordance with another embodiment, a window for an electronic device includes a corner part, and a main part configured to transmit light emitted by a display panel. The corner part is coupled to the main part and includes a first part having a first thickness and a second part having a second thickness, and wherein the first part is between the main part and the second part and the second thickness is greater than the first thickness.

An exterior surface of the corner part is rounded. Additionally, an interior surface of the first part has a first radius of curvature, and an interior surface of the second part has a second radius of curvature different from the first radius of curvature. In one embodiment, the second radius of curvature is greater than the first radius of curvature.

The corner part includes a third part positioned between the second part and a case, an interior surface of the third part having a third radius of curvature different from the second radius of curvature. The first radius of curvature may be equal to the third radius of curvature.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

Figure 1:
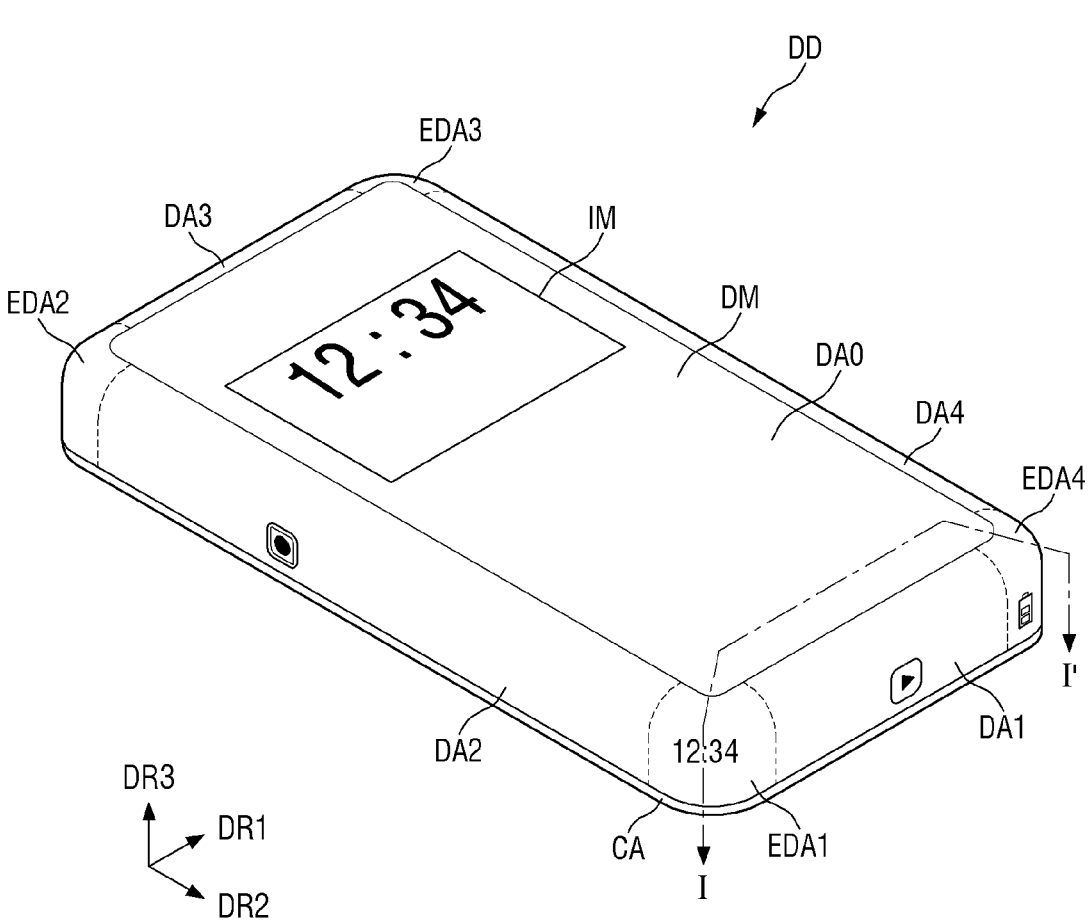
FIG. 1 is a perspective view of a display device according to an embodiment.
Figure 2:
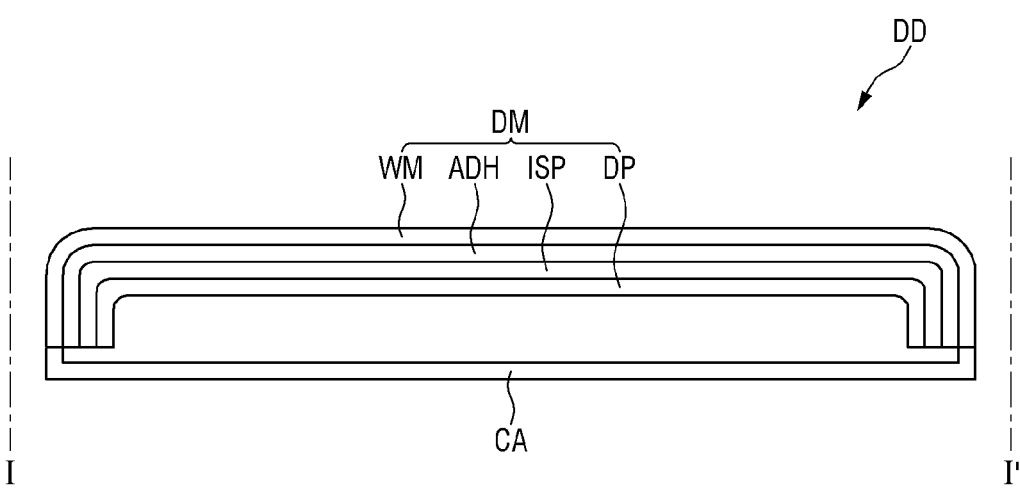
FIG. 2 is a cross-sectional view of the display device taken along line I-I' of FIG. 1.

FIG. 1 is a perspective view of a display device DD according to an embodiment. FIG. 2 is a cross-sectional view of the display device DD taken along line I-I' of FIG. 1.

Referring to FIGS. 1 to 2, the display device DD according to an embodiment may be a flexible display device. However, the present disclosure is not limited thereto, and the display device DD according to other embodiments may be a rigid display device. The display device DD according to the present embodiment may be applied to small and medium display devices. Examples include smartphones, tablet personal computers (PCs), vehicle navigation systems, game machines, and smart watches, as well as large display devices such as televisions or monitors. In the present embodiment, a smartphone has been illustrated as an example of the display device DD.

The display device DD may include a display module DM and a case CA. The display module includes a display area DA, which may be an area displaying an image IM. The display area DA may include a main display area DA0, first to fourth sub-display areas DA1, DA2, DA3, and DA4 adjacent to the main display area DA0, and first to fourth corner display areas EDA1, EDA2, EDA3, and EDA4.

The main display area DA0 may be parallel to a plane extending in a first direction DR1 and a second direction DR2. A normal direction of the main display area DA0 (e.g., a thickness direction of the display device DD) may extend in a third direction DR3. In the drawings, the first direction DR1 and the second direction DR2 are horizontal directions, respectively, and cross each other. For example, the first direction DR1 and the second direction DR2 may be orthogonal to each other. In addition, the third direction DR3 may be a perpendicular direction crossing, for example, orthogonal to, the first direction DR1 and the second direction DR2. Directions indicated by the first to third directions DR1, DR2, and DR3 may be relative concepts and may be switched to other directions in other embodiments.

The main display area DA0 may display the image IM through a front surface. For example, the main display area DA0 may display the image IM toward the third direction DR3. The image IM may include a still image as well as a dynamic (or moving) image. In FIG. 1, a watch window and icons have been illustrated as an example of the image IM.

The first sub-display area DA1 may be adjacent to the main display area DA0 on one side extending in the second direction DR2. The first sub-display area DA1 may display the image IM in a direction crossing the thickness direction DR3 of the display device DD. For example, when an angle formed by the main display area DA0 and the first sub-display area DA1 is 90°, the direction crossing the thickness direction DR3 may be one side in the second direction DR2.

The second sub-display area DA2 may be adjacent to the main display area DA0 on another side in the first direction DR1. The second sub-display area DA2 may display the image IM in a direction crossing the third direction DR3. For example, when an angle formed by the main display area DA0 and the second sub-display area DA2 is 90°, the direction crossing the third direction DR3 may correspond to the other side in the first direction DR1.

The third sub-display area DA3 may be adjacent to the main display area DA0 on another side in the second direction DR2. The third sub-display area DA3 may display the image IM in a direction crossing the third direction DR3. For example, when an angle formed by the main display area DA0 and the third sub-display area DA3 is 90°, the direction crossing the thickness direction DR3 may correspond to the other side in the second direction DR2.

The fourth sub-display area DA4 may be adjacent to the main display area DA0 on another side in the first direction DR1. The fourth sub-display area DA4 may display the image IM in a direction crossing the third direction DR3. For example, when an angle formed by the main display area DA0 and the fourth sub-display area DA4 is 90°, the direction crossing the third direction DR3 may be one side in the first direction DR1.

The first corner display area EDA1 may be positioned between the first sub-display area DA1 and the second sub-display area DA2. The first corner display area EDA1 may display the image IM in a direction crossing the thickness direction DR3 of the display device DD. For example, when an angle formed by the main display area DA0 and the first corner display area EDA1 is 90°, the direction crossing the thickness direction DR3 may be at least one direction between the first direction DR1 and the second direction DR2. The angle formed by the main display area DA0 and the first corner display area EDA1 may be different from 90° in other embodiments.

The second corner display area EDA2 may be positioned between the second sub-display area DA2 and the third sub-display area DA3. The second corner display area EDA2 may display the image IM in a direction crossing the thickness direction DR3 of the display device DD. For example, when an angle formed by the main display area DA0 and the second corner display area EDA2 is 90°, the direction crossing the thickness direction DR3 may be at least one direction between the first direction DR1 and the second direction DR2. The angle formed by the main display area DA0 and the second corner display area EDA2 may be different from 90° in other embodiments.

The third corner display area EDA3 may be positioned between the third sub-display area DA3 and the fourth sub-display area DA4. The third corner display area EDA3 may display the image IM in a direction crossing the thickness direction DR3 of the display device DD. For example, when an angle formed by the main display area DA0 and the third corner display area EDA3 is 90°, the direction crossing the thickness direction DR3 may be at least one direction between the first direction DR1 and the second direction DR2. The angle formed by the main display area DA0 and the third corner display area EDA3 may be different from 90° in other embodiments.

The fourth corner display area EDA4 may be positioned between the fourth sub-display area DA4 and the first sub-display area DA1. The fourth corner display area EDA4 may display the image IM in a direction crossing the thickness direction DR3 of the display device DD. For example, when an angle formed by the main display area DA0 and the fourth corner display area EDA4 is 90°, the direction crossing the thickness direction DR3 may be at least one direction between the first direction DR1 and the second direction DR2. The angle formed by the main display area DA0 and the fourth corner display area EDA4 may be different from 90° in other embodiments.

The main display area DA0 may be partially or completely surrounded by the first to fourth sub-display areas DA1, DA2, DA3, and DA4 and the first to fourth corner display areas EDA1, EDA2, EDA3, and EDA4.

The display module DM may include a display panel DP, an input sensing panel ISP, an adhesive member (or adhesive layer) ADH, and a window member (or window or window layer) WM. The display panel DP may include a light emitting display panel. The light emitting display panel may be, for example, an organic light emitting display panel or a quantum dot light emitting display panel. A light emitting layer of the organic light emitting display panel may include an organic light emitting material. A light emitting layer of the quantum dot light emitting display panel may include quantum dots, quantum rods, and the like. This is illustrative and in the present disclosure, the display panel DP is not particularly limited, e.g., different type of light emitting layer may be used in another embodiment. In an embodiment, an organic light emitting display panel has been illustrated as an example of the display panel DP, which will be described with reference to FIG. 3.

The input sensing panel ISP may be disposed on the display panel DP. The input sensing panel ISP may be directly disposed on the display panel DP or may be coupled to the display panel DP by an adhesive.

In some embodiments, the input sensing panel ISP may sense an external input by sensing a change in capacitance (or resistance) caused by contact with an external object. When a change in capacitance is sensed, the input sensing panel ISP may be referred to as a capacitive input sensing panel. In another embodiment, the input sensing panel ISP according to an embodiment may sense an external input by sensing a change in pressure due to an external object. In this case, the input sensing panel ISP may be referred to as a pressure-sensitive input sensing panel.

The adhesive layer ADH may be disposed between the window member WM and the input sensing panel ISP. The adhesive layer ADH may couple the window member WM and the input sensing panel ISP to each other. In one embodiment, the adhesive layer ADH may include a general adhesive. For example, the adhesive layer ADH may include a pressure sensitive adhesive (PSA), an optical clear adhesive (OCA), or an optical clear resin (OCR). In one embodiment, the adhesive layer ADH may be omitted.

The window member WM may be disposed on the adhesive layer ADH. The window member WM may cover all or a portion of the display panel DP. In one embodiment, the window member WM may completely cover the main display area DA0, the first to fourth sub-display areas DA1, DA2, DA3, and DA4, and the first to fourth corner display areas EDA1, EDA2, EDA3, and EDA4 of the display device DD. A shape of the display panel DP may correspond, for example, to a shape of the window member WM. The window member WM may protect the display panel DP from external impact and may serve as an input surface to a user.

The window member WM may be partially or completely transparent so that light generated from the display panel DP may be transmitted therethrough. The window member WM may include, for example, a glass or plastic material. In some embodiments, when the window member WM includes glass, the window member WM may include chemically ion-substituted tempered glass. In another embodiment, when the window member WM includes plastic, the window member WM may include a polyimide (PI) film.

The case CA may be disposed under the display module DM. The case CA may be adjacent to the display area DA and may have a predetermined color. The case CA may be disposed at the outermost portion of the display device DD and may accommodate components therein. The case CA may include a bottom surface and sidewalls extending from the bottom surface. In addition, electronic modules may be accommodated in an internal space corresponding to the bottom surface and the sidewalls. The electronic modules may include, for example, a camera, a flash, a fingerprint sensor, a battery, and a function sensor. The function sensor may include a proximity sensor, a color density detection sensor, an illuminance sensor, a motion sensor, a heartbeat sensor, or the like. However, these are just examples and the function sensor is not limited to the above-described examples. In addition, some of the camera, the flash, the fingerprint sensor, the battery, and the function sensor may be omitted, and other electronic modules may be further disposed.

The case CA may include a material having relatively higher rigidity than that of the display module DM. For example, the case CA may include one or more frames and/or plates made of glass, plastic, metal, or combinations thereof. The case CA may stably protect components of the display device DD from external impact.

Figure 3:
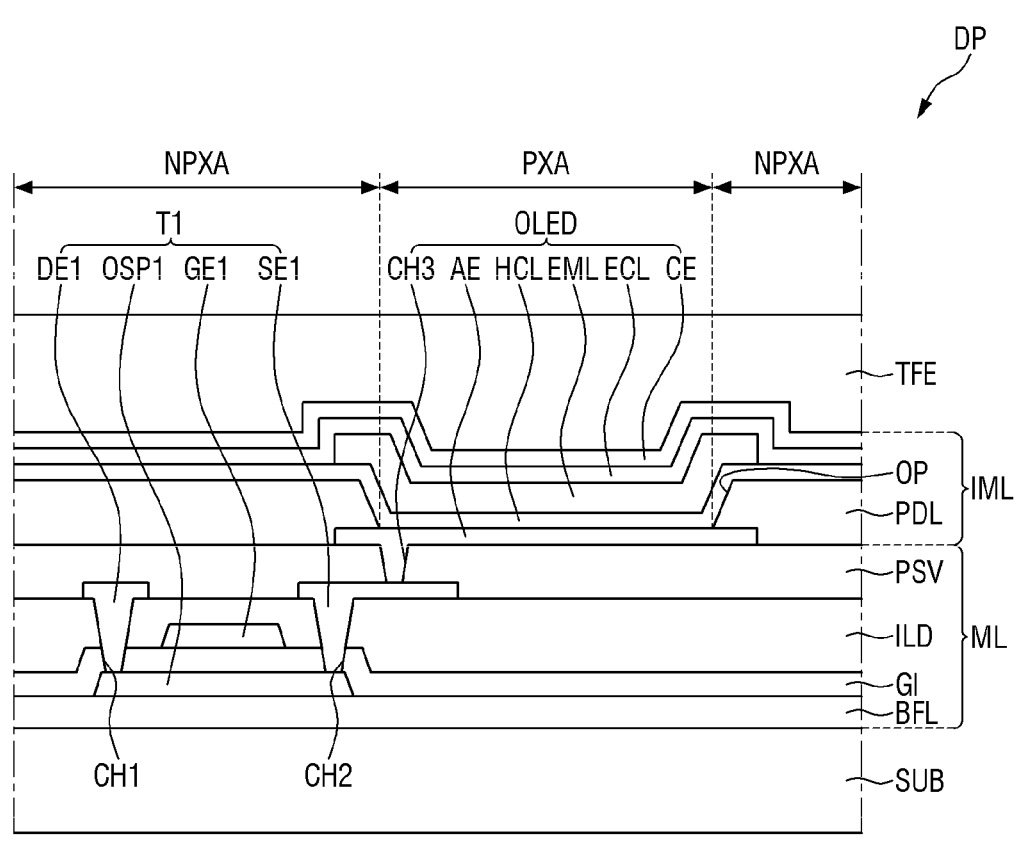
FIG. 3 is a cross-sectional view of a display panel according to an embodiment.
Figure 3:
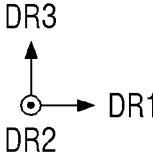

FIG. 3 is a cross-sectional view of a display panel according to an embodiment. Referring to FIG. 3, the display panel DP may include a base layer SUB, a circuit element layer ML, a display element layer IML, and a thin film encapsulation layer TFE. In one embodiment, the circuit element layer ML, the display element layer IML, and the thin film encapsulation layer TFE may be sequentially disposed on the base layer SUB.

The base layer SUB may include a synthetic resin film. For example, a synthetic resin layer may be formed on a working substrate used at the time of manufacturing the display panel DP. Then, a conductive layer, an insulating layer, and/or the like may be formed on the synthetic resin layer. When the working substrate is removed, the synthetic resin layer may correspond to the base layer SUB. In one embodiment, the synthetic resin layer may include a thermosetting resin. For example, the synthetic resin layer may be a polyimide-based resin layer. However, the material of the synthetic resin layer is not particularly limited. In addition, the base layer SUB may include an organic/inorganic composite material substrate or the like.

In one embodiment, the circuit element layer ML may include a buffer film BFL, a first intermediate inorganic film GI, and a second intermediate inorganic film ILD, which are inorganic films, and an intermediate organic film PSV, which is an organic film. Materials of the inorganic films and the organic film are not particularly limited, and in an embodiment the buffer film BFL may be optionally disposed or omitted.

A semiconductor pattern OSP1 of a transistor T1 may be disposed on the buffer film BFL. The material used to form the semiconductor pattern OSP1 may be, for example, amorphous silicon, polysilicon, or a metal oxide semiconductor.

The first intermediate inorganic film GI may be disposed on the semiconductor pattern OSP1. A control electrode GE1 of the transistor T1 may be disposed on the first intermediate inorganic film GI.

The second intermediate inorganic film ILD covering the control electrode GE1 may be disposed on the first intermediate inorganic film GI. An input electrode DE1 and an output electrode SE1 of the transistor T1 may be disposed on the second intermediate inorganic film ILD.

The input electrode DE1 and the output electrode SE1 may be connected to the semiconductor pattern OSP1, respectively, through a first through hole CH1 and a second through hole CH2 penetrating through the first intermediate inorganic film GI and the second intermediate inorganic film ILD. In another embodiment, the transistor T1 may be modified to have a bottom-gate structure.

The intermediate organic film PSV covering the input electrode DE1 and the output electrode SE1 may be disposed on the second intermediate inorganic film ILD. The intermediate organic film PSV may provide a flat surface.

The display element layer IML may be disposed on the intermediate organic film PSV. The display element layer IML may include a pixel defining film PDL and an organic light emitting diode OLED. The pixel defining film PDL may include an organic material. A first electrode AE may be disposed on the intermediate organic film PSV. The first electrode AE may be connected to the output electrode SE1 through a third through hole CH3 penetrating through the intermediate organic film PSV. An opening OP may be included in the pixel defining film PDL. The opening OP may expose at least a portion of the first electrode AE. In one embodiment, the pixel defining film PDL may be omitted.

In an embodiment, an emission area PXA may overlap the transistor T1.

A hole control layer HCL may be disposed in common in the emission area PXA and a non-emission area NPXA. A light emitting layer EML may be disposed on the hole control layer HCL. The light emitting layer EML may be disposed in an area corresponding to the opening OP. The light emitting layer EML may include an organic material and/or an inorganic material. The light emitting layer EML may generate a predetermined color of light.

An electron control layer ECL may be disposed on the light emitting layer EML. A second electrode CE may be disposed on the electron control layer ECL.

The thin film encapsulation layer TFE may be disposed on the second electrode CE. The thin film encapsulation layer TFE may partially or entirely cover the second electrode CE. In one embodiment, a capping layer covering the second electrode CE may be further disposed between the thin film encapsulation layer TFE and the second electrode CE. In this case, the thin film encapsulation layer TFE may directly cover the capping layer.

Figure 4:
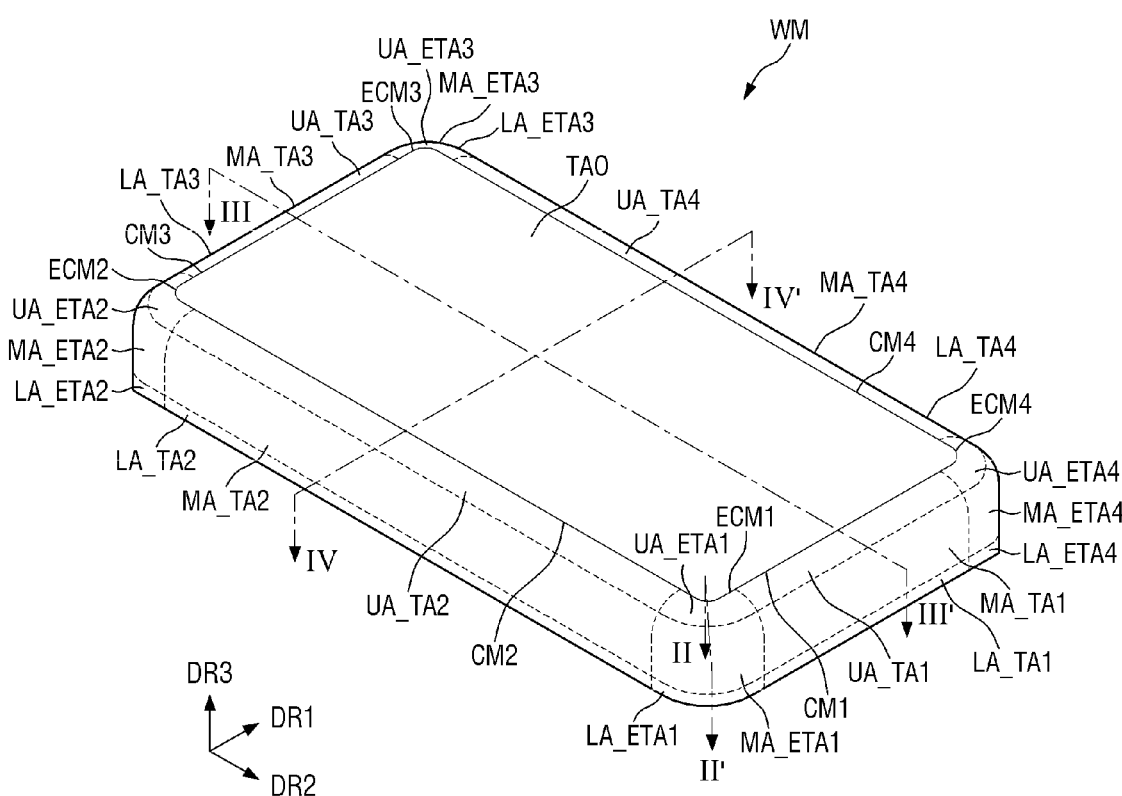
FIG. 4 is a perspective view of a window member according to an embodiment.

FIG. 4 is a perspective view of a window member according to an embodiment. Referring to FIG. 4, the window member WM may include a main part TA0, first to fourth side parts TA1, TA2, TA3, and TA4, and first to fourth corner parts ETA1, ETA2, ETA3, and ETA4.

The main part TA0 may be parallel to a plane extending in the first direction DR1 and the second direction DR2. The main part TA0 may include a first side CM1 extending in the first direction DR1, a second side CM2 crossing the first side CM1 and extending in the second direction DR2, a third side CM3 crossing the second side CM2 and extending in the first direction DR1, and a fourth side CM4 crossing the third side CM3 and extending in the second direction DR2. The first side CM1 may be parallel to the third side CM3, and the second side CM2 may be parallel to the fourth side CM4. In addition, the main part TA0 may include a first corner side ECM1 connecting the first side CM1 and the second side CM2 to each other, a second corner side ECM2 connecting the second side CM2 and the third side CM3 to each other, a third corner side ECM3 connecting the third side CM3 and the fourth side CM4 to each other, and a fourth corner side ECM4 connecting the fourth side CM4 and the first side CM1 to each other.

The first side part TA1 may be adjacent to the first side CM1 in the second direction DR2. The second side part TA2 may be adjacent to the second side CM2 in the first direction DR1. The third side part TA3 may be adjacent to the third side CM3 in the second direction DR2. The third side part TA3 may be spaced apart from the first side part TA1 in the second direction DR2 with the main part TA0 interposed therebetween. The fourth side part TA4 may be adjacent to the fourth side CM4 in the first direction DR1. The fourth side part TA4 may be spaced apart from the second side part TA2 in the first direction DR1, with the main part TA0 interposed therebetween.

The first corner part ETA1 may be adjacent to the first side part TA1 and the second side part TA2. The first corner part ETA1 may connect the first side part TA1 and the second side part TA2 to each other, and may be disposed between the first side part TA1 and the second side part TA2. The other end of the first corner part ETA1 in the third direction DR3 may have, for example, a convex curved shape in plan view. The other end of the first corner part ETA1 may have a different shape in another embodiment.

The second corner part ETA2 may be adjacent to the second side part TA2 and the third side part TA3. The second corner part ETA2 may connect the second side part TA2 and the third side part TA3 to each other, and may be disposed between the second side part TA2 and the third side part TA3. The other end of the second corner part ETA2 in the third direction DR3 may have a convex curved shape in plan view. The other end of the second corner part ETA2 may have a different shape in another embodiment.

The third corner part ETA3 may be adjacent to the third side part TA3 and the fourth side part TA4. The third corner part ETA3 may connect the third side part TA3 and the fourth side part TA4 to each other, and may be disposed between the third side part TA3 and the fourth side part TA4. The other end of the third corner part ETA3 in the third direction DR3 may have a convex curved shape in plan view. The other end of the third corner part ETA3 may have a different shape in another embodiment.

The fourth corner part ETA4 may be adjacent to the fourth side part TA4 and the first side part TA1. The fourth corner part ETA4 may connect the fourth side part TA4 and the first side part TA1 to each other, and may be disposed between the fourth side part TA4 and the first side part TA1. The other end of the fourth corner part ETA4 in the third direction DR3 may have a convex curved shape in plan view. The other end of the fourth corner part ETA4 may have a different shape in another embodiment.

The window member WM may allow the image IM (e.g., see FIG. 1) to be seen by transmitting light emitted from the display panel DP (e.g., see FIG. 2) through the main part TA0, the first to fourth side parts TA1, TA2, TA3, and TA4, and the first to fourth corner parts ETA1, ETA2, ETA3, and ETA4.

In one embodiment, the first to fourth side parts TA1, TA2, TA3, and TA4 and the first to fourth corner parts ETA1, ETA2, ETA3, and ETA4 may be bent from the main part TA0. The first to fourth side parts TA1, TA2, TA3, and TA4 may be bent from the first to fourth sides CM1, CM2, CM3, and CM4, respectively, and the first to fourth corner parts ETA1, ETA2, ETA3 and ETA4 may be bent from the first to fourth corner sides ECM1, ECM2, ECM3, and ECM4, respectively.

Each of the first to fourth side parts TA1, TA2, TA3, and TA4 and the first to fourth corner parts ETA1, ETA2, ETA3, and ETA4 may include three areas. The first side part TA1 may include a first upper side part UA_TA1, a first middle side part MA_TA1, and a first lower side part LA_TA1. The second side part TA2 may include a second upper side part UA_TA2, a second middle side part MA_TA2, and a second lower side part LA_TA2. The third side part TA3 may include a third upper side part UA_TA3, a third middle side part MA_TA3, and a third lower side part LA_TA3. The fourth side part TA4 may include a fourth upper side part UA_TA4, a fourth middle side part MA_TA4, and a fourth lower side part LA_TA4.

The first corner part ETA1 may include a first upper corner part UA_ETA1, a first middle corner part MA_ETA1, and a first lower corner part LA_ETA1. The second corner part ETA2 may include a second upper corner part UA_ETA2, a second middle corner part MA_ETA2, and a second lower corner part LA_ETA2. The third corner part ETA3 may include a third upper corner part UA_ETA3, a third middle corner part MA_ETA3, and a third lower corner part LA_ETA3. The fourth corner part ETA4 may include a fourth upper corner part UA_ETA4, a fourth middle corner part MA_ETA4, and a fourth lower corner part LA_ETA4.

Each of the first to fourth upper side parts UA_TA1, UA_TA2, UA_TA3, and UA_TA4 may be adjacent to the main part TA0. The first to fourth upper side parts UA_TA1, UA_TA2, UA_TA3, and UA_TA4 may be in direct or indirect contact with the first to fourth sides CM1, CM2, CM3, and CM4 of the main part TA0, respectively. The first to fourth middle side parts MA_TA1, MA_TA2, MA_TA3, and MA_TA4 may be adjacent to the first to fourth upper side parts UA_TA1, UA_TA2, UA_TA3, and UA_TA4, respectively. The first to fourth middle side parts MA_TA1, MA_TA2, MA_TA3, and MA_TA4 may be positioned on sides opposite to the main part TA0, with the first to fourth upper side parts UA_TA1, UA_TA2, UA_TA3, and UA_TA4 interposed therebetween, respectively. The first to fourth lower side parts LA_TA1, LA_TA2, LA_TA3, and LA_TA4 may be adjacent to the first to fourth middle side parts MA_TA1, MA_TA2, MA_TA3, and MA_TA4, respectively. The first to fourth lower side parts LA_TA1, LA_TA2, LA_TA3, and LA_TA4 may be positioned on sides opposite to the first to fourth upper side parts UA_TA1, UA_TA2 and UA_TA3, and UA_TA4, with the first to fourth middle side parts MA_TA1, MA_TA2, MA_TA3, and MA_TA4 interposed therebetween, respectively.

Each of the first to fourth upper corner parts UA_ETA1, UA_ETA2, UA_ETA3, and UA_ETA4 may be adjacent to the main part TA0. The first to fourth upper corner parts UA_ETA1, UA_ETA2, UA_ETA3, and UA_ETA4 may be in direct or indirect contact with the first to fourth corner sides ECM1, ECM2, ECM3, and ECM4 of the main part TA0, respectively. The first to fourth middle corner parts MA_ETA1, MA_ETA2, MA_ETA3, and MA_ETA4 may be adjacent to the first to fourth upper corner parts UA_ETA1, UA_ETA2, UA_ETA3, and UA_ETA4, respectively. The first to fourth middle corner parts MA_ETA1, MA_ETA2, MA_ETA3, and MA_ETA4 may be positioned on sides opposite to the main part TA0, with the first to fourth upper corner parts UA_ETA1, UA_ETA2, UA_ETA3, and UA_ETA4 interposed therebetween, respectively.

The first to fourth lower corner parts LA_ETA1, LA_ETA2, LA_ETA3, and LA_ETA4 may be adjacent to the first to fourth middle corner parts MA_ETA1, MA_ETA2, MA_ETA3, and MA_ETA4, respectively. The first to fourth lower corner parts LA_ETA1, LA_ETA2, LA_ETA3, and LA_ETA4 may be positioned on sides opposite to the first to fourth upper corner parts UA_ETA1, UA_ETA2, UA_ETA3, and UA_ETA4, with the first to fourth middle corner parts MA_ETA1, MA_ETA2, MA_ETA3, and MA_ETA4 interposed therebetween, respectively. Examples of shapes of the first to fourth side parts and the first to fourth corner parts will be described in more detail with reference to FIGS. 5 to 7.

Figure 5:
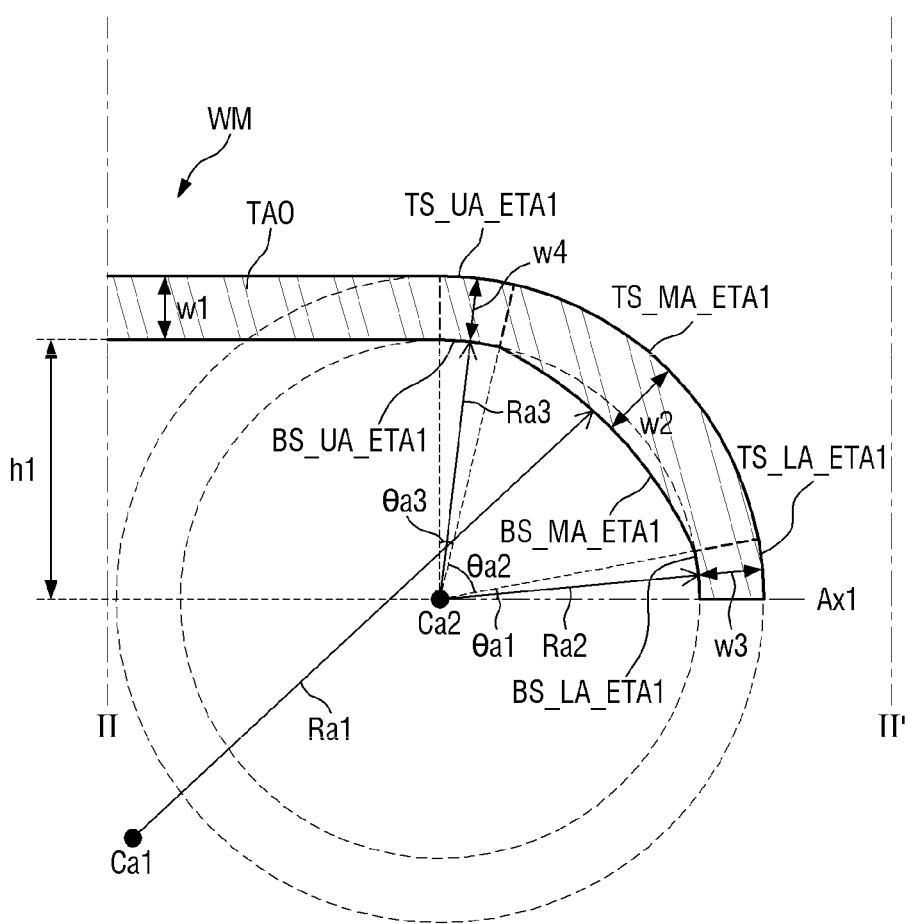
FIG. 5 is a cross-sectional view of the window member taken along line II-IF of FIG. 4.
Figure 6:
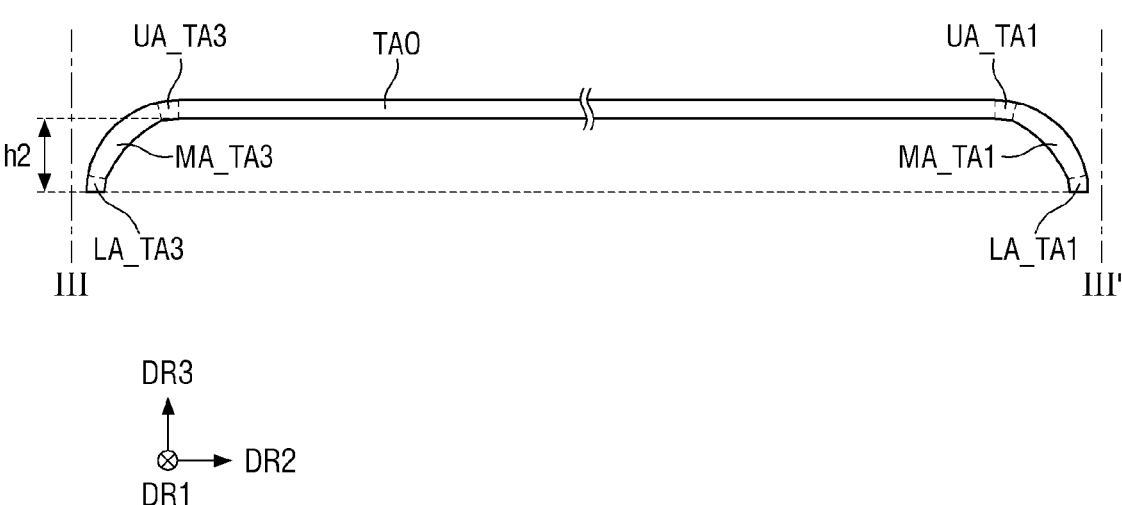
FIG. 6 is a cross-sectional view of the window member taken along line of FIG. 4.
Figure 7:
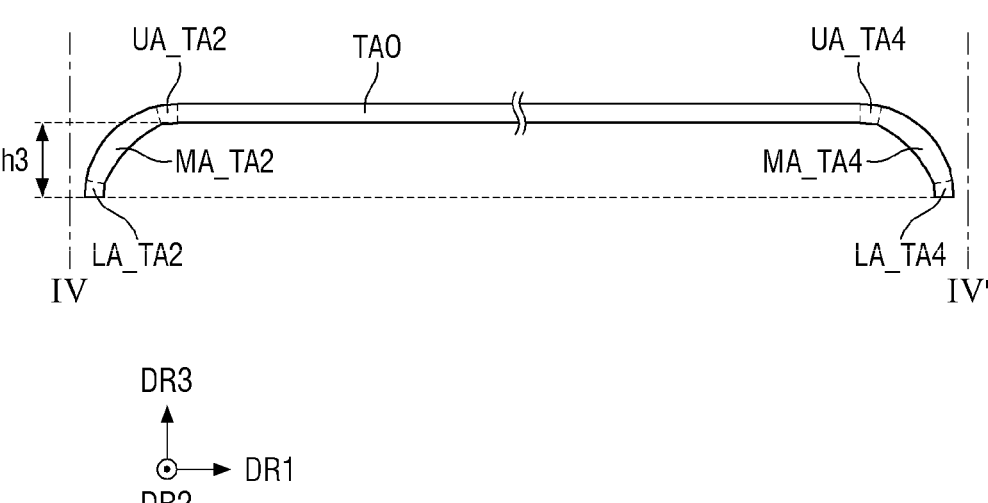
FIG. 7 is a cross-sectional view of the window member taken along line IV-IV' (e.g., transverse line) of FIG. 4.

FIG. 5 is a cross-sectional view of the window member taken along line II-IF of FIG. 4. FIG. 6 is a cross-sectional view of the window member taken along line of FIG. 4. FIG. 7 is a cross-sectional view of the window member taken along line IV-IV' of FIG. 4.

Referring to FIG. 5, an upper surface and a lower surface of the first corner part ETA1 may include a convex shape in at least one direction. As an example, shapes of the upper surface and the lower surface of the first corner part ETA1 may include a portion of a circle or an ellipse. However, shapes of circles illustrated by dotted lines in FIG. 5 and the like are only for expressing curvatures of portions of the upper surface and the lower surface of the first corner part ETA1. This illustration is not intended to limit the shapes of the upper surface and the lower surface of the first corner part ETA1, e.g., the upper surface and the lower surface of the first corner part ETA1 may be curved differently in other embodiments. In some embodiments, the first corner part ETA1 may include several curved surfaces having different curvatures in at least a portion thereof.

In one embodiment, a radius of curvature Ra1 of a lower surface BS_MA_ETA1 of the first middle corner part MA_ETA1 may be different from (e.g., greater than) a radius of curvature Ra2 of a lower surface BS_LA_ETA1 of the first lower corner part LA_ETA1 and a radius of curvature Ra3 of a lower surface BS_UA_ETA1 of the first upper corner part UA_ETA1. Since the curvature of each surface may correspond to the reciprocal of a radius of curvature, the curvature of the lower surface BS_MA_ETA1 of the first middle corner part MA_ETA1 may be less than the curvature of the lower surface BS_LA_ETA1 of the first lower corner part LA_ETA1 and the curvature of the lower surface BS_UA_ETA1 of the first upper corner part UA_ETA1. In FIG. 5, it has been illustrated that the curvatures of the lower surfaces BS_UA_ETA1 and BS_LA_ETA1 of the first upper corner part UA_ETA1 and the first lower corner part LA_ETA1 are the same as each other, but these curvatures may be different from one another in another embodiment.

Also, as shown in FIG. 5, the center of curvature Ca1 of the lower surface BS_MA_ETA1 of the first middle corner part MA_ETA1 may be different from the centers of curvature Ca2 of the lower surfaces BS_UA_ETA1 and BS_LA_ETA1 of the first upper corner part UA_ETA1 and the first lower corner part LA_ETA1. In FIG. 5, it has been illustrated that the centers of curvature of the lower surfaces BS_UA_ETA1 and BS_LA_ETA1 of the first upper corner part UA_ETA1 and the first lower corner part LA_ETA1 are the same as each other, but these centers of curvature may be different in other embodiments.

In some embodiments, upper surfaces TS_UA_ETA1, TS_MA_ETA1, and TS_LA_ETA1 of the first upper corner part UA_ETA1, the first middle corner part MA_ETA1, and the first lower corner part LA_ETA1 may have the same curvature. Each of the lower surfaces BS_UA_ETA1 and BS_LA_ETA1 of the first upper corner part UA_ETA1 and the first lower corner part LA_ETA1 may have the same center of curvature Ca2 as the center of curvature of each of the upper surfaces TS_UA_ETA1, TS_MA_ETA1, and TS_LA_ETA1 of the first upper corner part UA_ETA1, the first middle corner part MA_ETA1, and the first lower corner part LA_ETA1. These curvatures, or centers of curvature, may be different in other embodiments.

In one embodiment, a virtual circular coordinate system may have the center of curvature Ca2 of each of the upper surfaces TS_UA_ETA1, TS_MA_ETA1, and TS_LA_ETA1 of the first upper corner part UA_ETA1, the first middle corner part MA_ETA1, and the first lower corner part LA_ETA1 as the origin. In this case, an extension line of one end of the first corner part ETA1 may be referred to as a first axis Ax1. Given such a coordinate system, an angle formed by a boundary between the first lower corner part LA_ETA1 and the first middle corner part MA_ETA1 and the first member axis Ax1 may be a first angle $\theta a1$, an angle formed by a boundary between the first middle corner part MA_ETA1 and the first upper corner part UA_ETA1 and the boundary between the first lower corner part LA_ETA1 and the first middle corner part MA_ETA1 may be a second angle $\theta a2$, and an angle formed by a boundary between the first upper corner part UA_ETA1 and the main part TA0 and the boundary between the first middle corner part MA_ETA1 and the first upper corner part UA_ETA1 may be a third angle $\theta a3$. In an embodiment, the sum of the first to third angles $\theta a1$, $\theta a2$, and $\theta a3$ may be 90°, although the sum of these angles may be different from 90° in another embodiment.

In one embodiment, the second angle $\theta a2$ may be greater than the first angle $\theta a1$ and the third angle $\theta a3$. As an example, the second angle $\theta a2$ may be a predetermined number of (e.g., about 3 to 5) times greater than each of the first angle $\theta a1$ and the third angle $\theta a3$.

The main part TA0 may have a first maximum thickness w1, the first middle corner part MA_ETA1 may have a second maximum thickness w2, the first lower corner part LA_ETA1 may have a third maximum thickness w3, and the first upper corner part UA_ETA1 may have a fourth maximum thickness w4.

In an embodiment, a thickness of the main part TA0 may be constant as the first maximum thickness w1, a thickness of the first lower corner part LA_ETA1 may be constant as the third maximum thickness w3, and a thickness of the first upper corner part UA_ETA1 may be constant as the fourth maximum thickness w4. In one embodiment, a thickness of the first middle corner part MA_ETA1 may increase from the first upper corner part UA_ETA1 and the first lower corner part LA_ETA1 adjacent to the first middle corner part MA_ETA1 toward a middle portion of the first middle corner part MA_ETA1. The thickness of the first middle corner part MA_ETA1 may have the second maximum thickness w2 at the middle portion.

In one embodiment, thickness may refer to the shortest distance among the distances from any one point of a lower surface of the window member WM to any one point of an upper surface of the window member WM, and maximum thickness may refer to the greatest thickness of thicknesses.

In one embodiment, the second maximum thickness w2 may be greater than each of the third maximum thickness w3 and the fourth maximum thickness w4. The second maximum thickness w2 is greater than each of the third and fourth maximum thicknesses w3 and w4. Thus, a breakage or buckling phenomena of the first corner part ETA1 may be prevented.

In some embodiments, the second maximum thickness w2 may be greater than each of the third and fourth maximum thicknesses w3 and w4 by a predetermined amount, e.g., about 0.04 to about 0.2 times the third and fourth maximum thicknesses w3 and w4. As an example, the second maximum thickness w2 may be greater than each of the third and fourth maximum thicknesses w3 and w4 by a predetermined amount, e.g., about 0.02 mm or more and about 0.1 mm or less. When the difference between the second maximum thickness w2 and each of the third and fourth maximum thicknesses w3 and w4 is greater than or equal to about 0.04 times the third and fourth maximum thicknesses w3 and w4, a breakage or buckling phenomena of the first corner part ETA1 may be prevented. When the difference is less than or equal to about 0.2 times each of the third and fourth maximum thicknesses w3 and w4, the shape of the window member WM does not collapse and a desired shape of the window member WM may be obtained, in a manufacturing process of a window member WM to be described later.

In one embodiment, each of the third and fourth maximum thicknesses w3 and w4 may be substantially the same as the first maximum thickness w1. Here, the phrase "substantially the same" may refer to the case where a difference between each of the third and fourth maximum thicknesses w3 and w4 and the first maximum thickness w1 is less than or equal to a predetermined number of (e.g., about 0.01) times the first maximum thickness w1. When each of the third and fourth maximum thicknesses w3 and w4 are the same as the first maximum thickness w1, it may be possible to prevent the formation of burrs at one end of the first corner part ETA1.

The first corner part ETA1 has been described above by way of example with reference to FIG. 5. But, referring to FIGS. 4 to 7 the first to fourth side parts TA1, TA2, TA3, and TA4 and the second to fourth corner parts ETA2, ETA3, and ETA4 may have the same shape as that of the first corner part ETA1 described above. In other embodiments, the present disclosure is not limited thereto, and the shapes of the first to fourth side parts TA1, TA2, TA3, and TA4 and the first to fourth corner parts ETA1, ETA2, ETA3, and ETA4 may be different from each other.

Referring again to FIG. 5, in the window member WM according to one embodiment, a first height h1 may correspond to a height from a lower surface of the main part TA0 to ends of each of the first to fourth corner parts ETA1, ETA2, ETA3, and ETA4. The first height h1 may be the same as a second height h2 (e.g., see FIG. 6), which is a height from the lower surface of the main part TA0 to ends of each of the first side part TA1 and the third side part TA3.

A third height h3 (e.g., see FIG. 7) may correspond to a height from the lower surface of the main part TA0 to ends of each of the second side part TA2 and the fourth side part TA4.

Hereinafter, embodiments of an apparatus for manufacturing a window member will be described with reference to FIGS. 8 to 18.

Figure 8:
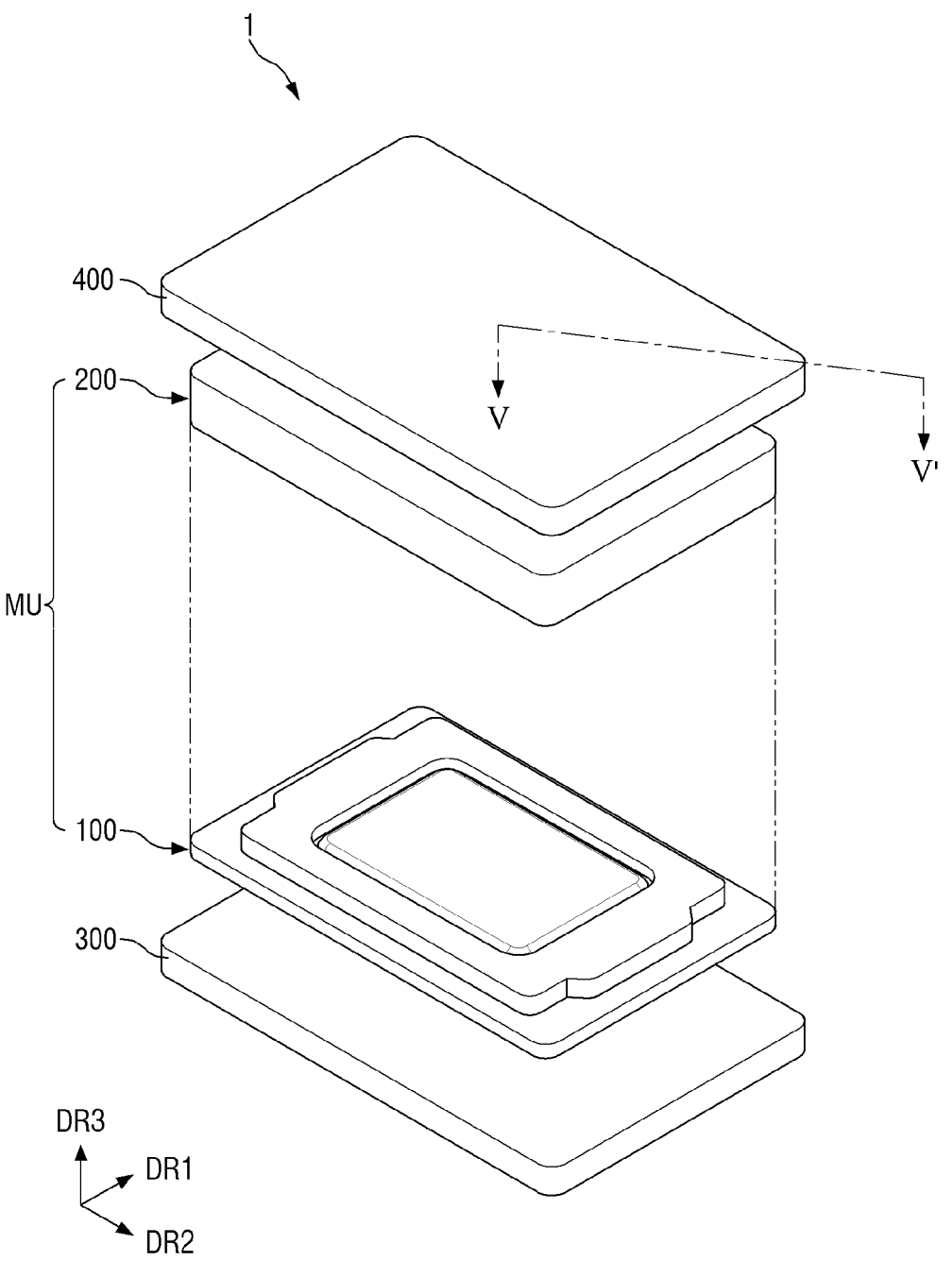
FIG. 8 is a perspective view of an apparatus for manufacturing a window member according to an embodiment.

FIG. 8 is a perspective view of an apparatus for manufacturing a window member according to an embodiment. Referring to FIG. 8, an apparatus 1 for manufacturing a window member according to the embodiments described herein may include a mold unit MU including a lower mold 100 (e.g., a first mold) and an upper mold 200 (e.g., a second mold), and may further include a lower heat source 300 (e.g., a first heat source) and an upper heat source 400 (e.g., a second heat source). The apparatus 1 for manufacturing the window member may be one for bending and molding at least a portion of a manufacturing target, for example, a window member WM' (e.g., see FIG. 20) before being molded in the third direction DR3 in a plane extending in the first direction DR1 and the second direction DR2.

The mold unit MU may include the lower mold 100 and the upper mold 200. The lower mold 100 may be disposed to face the upper mold 200 in the third direction DR3. The lower mold 100 may have a lower mold surface formed in an upper surface thereof so as to extend in the first direction DR1 and the second direction DR2 and to face the upper mold 200. The upper mold 200 may be disposed to face the lower mold 100 in the third direction DR3. The upper mold 200 may have an upper mold surface formed in a lower surface thereof so as to extend in the first direction DR1 and the second direction DR2 and to face the lower mold 100.

The lower mold 100 and the upper mold 200 may be mold members for bending and molding the window member WM' (e.g., see FIG. 20) before being molded, which is the manufacturing target. Before being molded, the window member WM' (e.g., see FIG. 20) may be bent and molded by the lower mold surface and the upper mold surface. In an embodiment, a shape of the window member WM (bent by a manufacturing process of a window member to be described later) may be substantially the same as a shape of a space formed by the lower mold surface and the upper mold surface.

The lower heat source 300 may be disposed to be spaced apart from the upper mold 200, with the lower mold 100 interposed therebetween. The lower heat source 300 may be configured to transfer heat to the upper mold 200 through the lower mold 100. For example, the lower heat source 300 may be a heating plate in close contact with a lower surface of the lower mold 100.

The upper heat source 400 may be disposed to be spaced apart from the lower mold 100, with the upper mold 200 interposed therebetween. The upper heat source 400 may be configured to transfer heat to the lower mold 100 through the upper mold 200. For example, the upper heat source 400 may be a heating plate in close contact with an upper surface of the upper mold 200.

An embodiment of the lower mold 100 will be described in more detail with reference to FIGS. 9 to 14.

Figure 9:
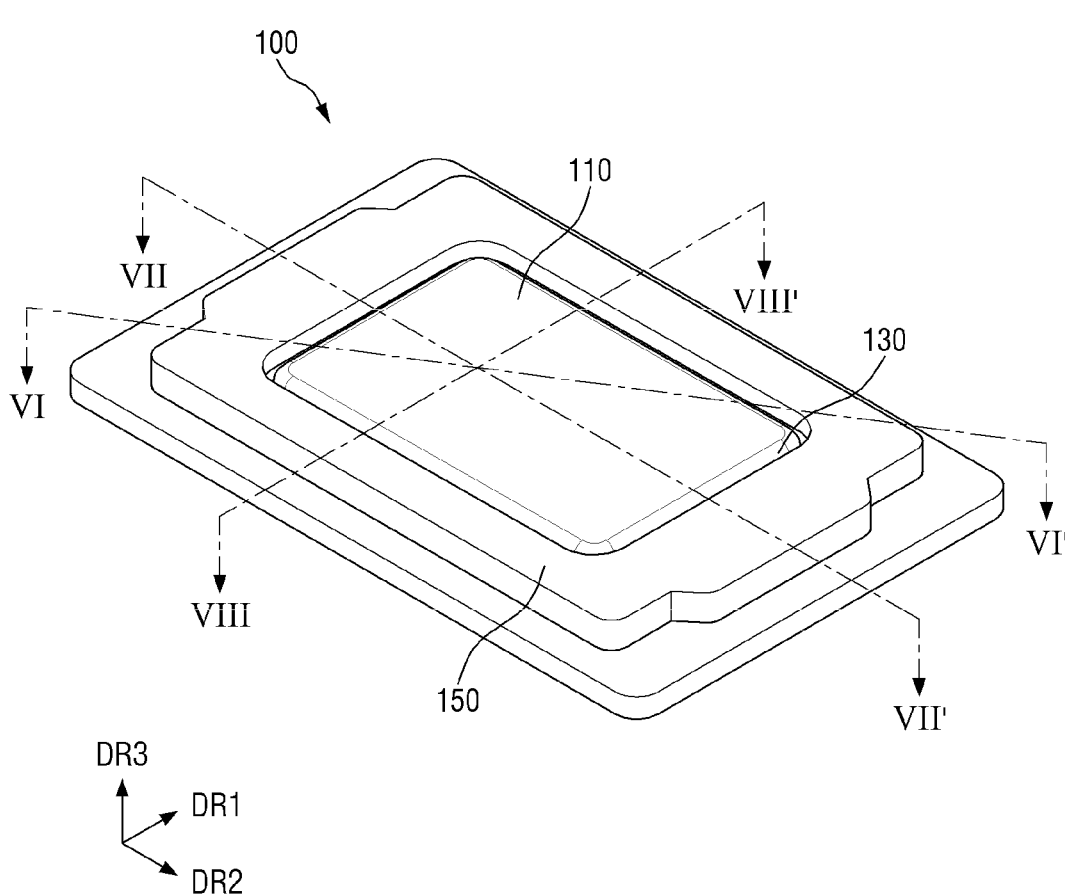
FIG. 9 is a perspective view of a lower mold according to an embodiment.
Figure 10:
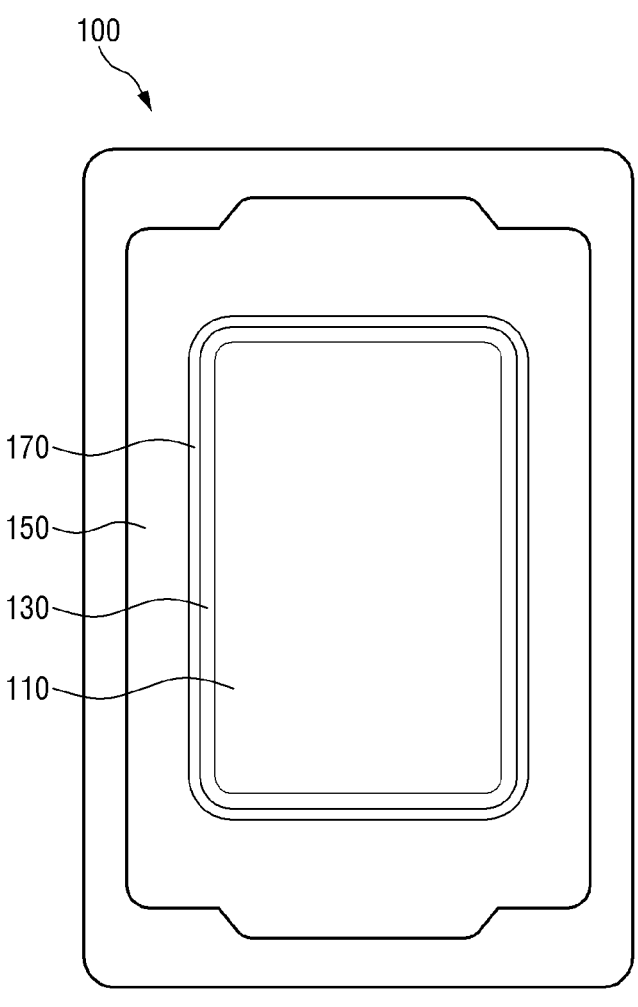
FIG. 10 is a plan view of the lower mold according to an embodiment.
Figure 10:
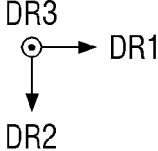
Figure 11:
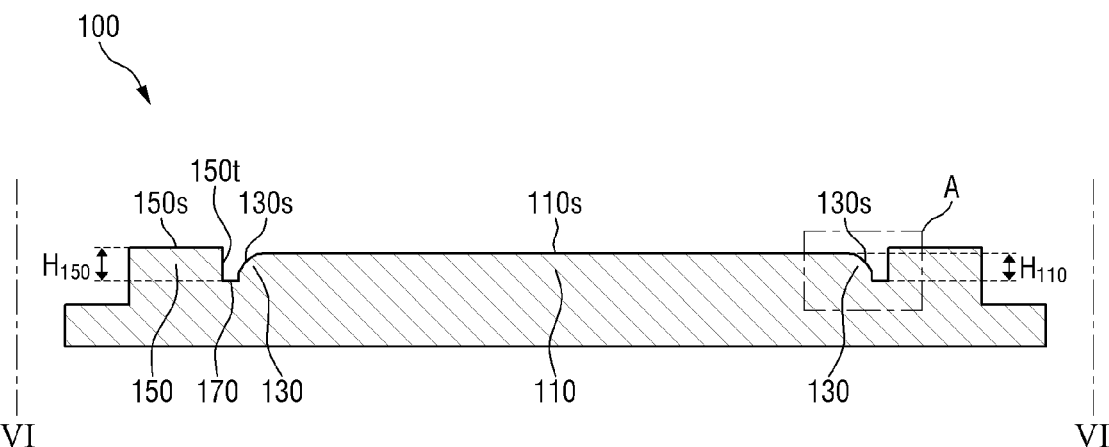
FIG. 11 is a cross-sectional view of the lower mold taken along line VI-VI' (diagonal line) of FIG. 9.
Figure 12:
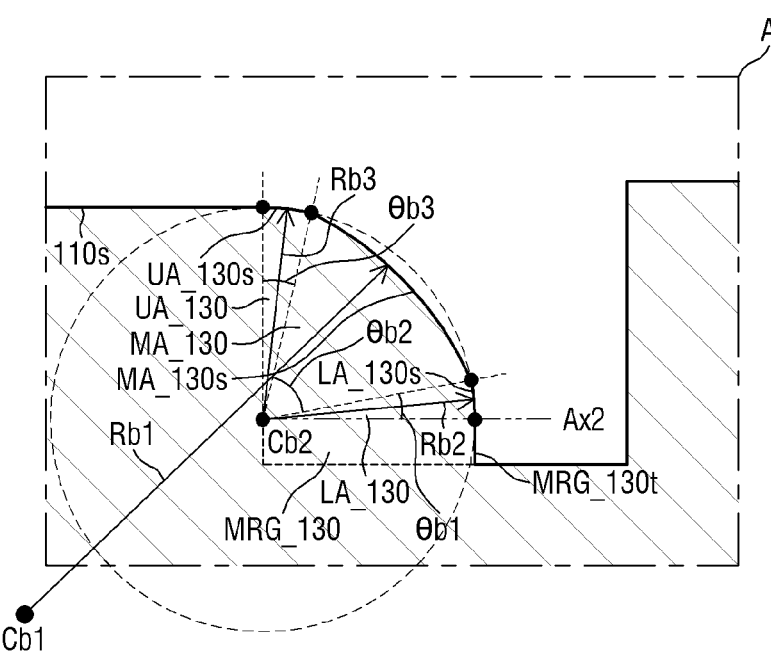
FIG. 12 is an enlarged view of portion 'A' of FIG. 11.
Figure 13:
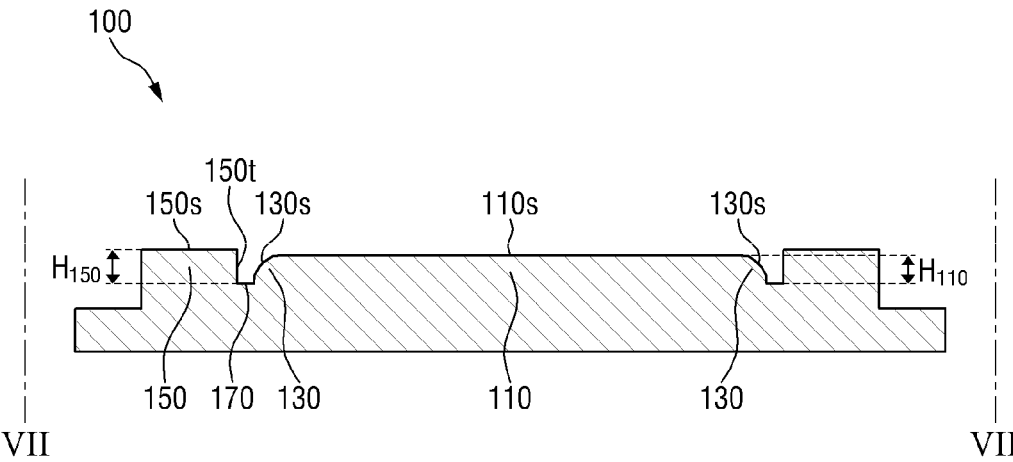
FIG. 13 is a cross-sectional view of the lower mold taken along line VII-VII' of FIG. 9.
Figure 13:
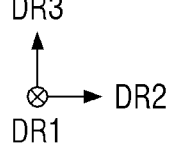
Figure 14:
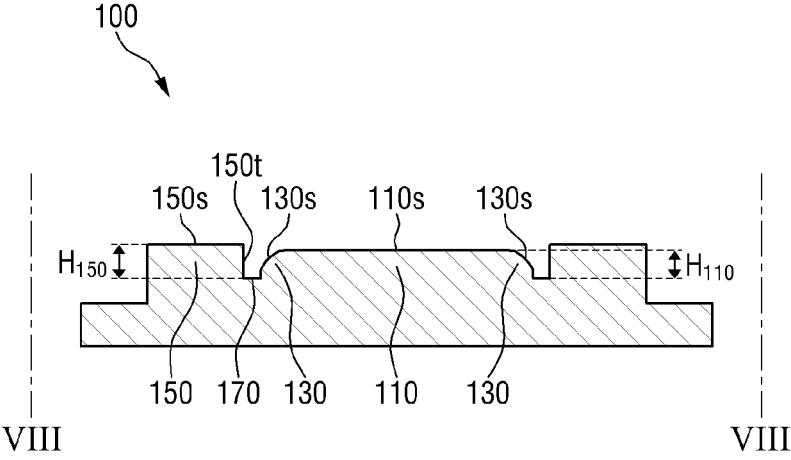
FIG. 14 is a cross-sectional view of the lower mold taken along line VIII-VIII' of FIG. 9.
Figure 14:
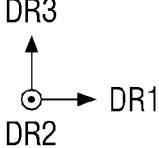

FIG. 9 is a perspective view of the lower mold according to an embodiment. FIG. 10 is a plan view of the lower mold according to an embodiment. FIG. 11 is a cross-sectional view of the lower mold taken along line VI-VI' of FIG. 9. FIG. 12 is an enlarged view of portion 'A' of FIG. 11. FIG. 13 is a cross-sectional view of the lower mold taken along line VII-VII' of FIG. 9. FIG. 14 is a cross-sectional view of the lower mold taken along line VIII-VIII' of FIG. 9.

Referring to FIGS. 9 to 14, the lower mold 100 may be at least partially in close contact with the window member WM' (e.g., see FIG. 20) before being molded, which is the manufacturing target, in a bending process by forming the lower mold surface.

In an embodiment, the lower mold 100 may include a lower support part 110, a lower bending molding part 130, and a lower sidewall part 150. The lower support part 110 may include a lower support surface 110s on an upper surface thereof. The shape of the lower support surface 110s may substantially correspond to the shape of the lower surface of the main part TA0 of the window member WM (e.g., see FIG. 4) bent after being manufactured. In an embodiment, the lower support surface 110s may be a substantially flat surface. However, the present disclosure is not limited thereto. For example, the lower support surface 110s may include a curved surface having a curvature in at least a partial area thereof. The lower support part 110 may stably support and fix a bending target in the bending process.

The lower bending molding part 130 may be positioned to surround the lower support part 110. The lower bending molding part 130 may be formed adjacent to both sides of the lower support part 110 in the first direction DR1 and the second direction DR2 and be integrally formed without a physical boundary. The lower bending molding part 130 may be adjacent to respective sides of the lower support part 110 in the first direction DR1, and may have a shape which extends in the second direction DR2. Additionally, the lower bending molding part 130 may be adjacent to respective sides of the lower support part 110 in the second direction DR2 may have a shape which extends in the first direction DR1.

The lower bending molding part 130 may include a lower molding surface 130s rounded in the third direction DR3 from the lower support part 110. The lower molding surface 130s may have a downward inclination relative to an upper surface of the lower support part 110 and extending towards a lower sidewall part 150 to be described later.

The lower bending molding part 130 may be a part that causes a shape deformation of the manufacturing target in the bending process. In some embodiments, a shape of the lower molding surface 130s may substantially correspond to shapes of the lower surfaces of the first to fourth side parts TA1, TA2, TA3, and TA4 and the first to fourth corner parts ETA1, ETA2, ETA3, and ETA4 of the window member WM (e.g., see FIG. 4) bent after being manufactured.

The lower sidewall part 150 may be positioned to surround the lower bending molding part 130. The lower sidewall part 150 may be formed adjacent to respective sides of the lower bending molding part 130 in the first direction DR1 and the second direction DR2 and be integrally formed without a physical boundary. The lower sidewall part 150 may be adjacent to respective sides of the lower bending molding part 130 in the first direction DR1, and may have a shape which extends in the second direction DR2. The lower sidewall part 150 may be adjacent to respective sides of the lower bending molding part 130 in the second direction DR2, and may have a shape which extends in the first direction DR1. As described above, the lower bending molding part 130 may have a downward inclination extending towards the lower sidewall part 150.

The lower mold 100 may include a valley 170 positioned between the lower bending molding part 130 and the lower sidewall part 150. The valley 170 may constitute the lowest level of the lower bending molding part 130. The valley 170 may have an approximately flat surface. The valley 170 may prevent the manufacturing target from being damaged by the lower sidewall part 150 by securing a process margin in the bending process.

The lower bending molding part 130 and the lower sidewall part 150 may be spaced apart from each other with the valley 170 interposed therebetween. In some embodiments, a side surface 150*t* of the lower sidewall part 150 and the lower molding surface 130*s* of the lower bending molding part 130 may be spaced apart from each other in the first direction DR1 or the second direction DR2.

In one embodiment, an upper surface 150*s* of the lower sidewall part 150 may be formed to have the highest level, which is higher than the highest level of the upper surface of the lower support surface 110*s* of the lower support part 110. For example, a height H$_{150}$ (which extends to the upper surface 150*s* of the lower sidewall part 150) may be greater than a height H$_{110}$ which extends to the lower support surface 110*s* of the lower support part 110. Thus, the height difference H$_{150}$ between the upper surface 150*s* of the lower sidewall part 150 and the valley 170 may be greater than the height difference H$_{110}$ between the lower support surface 110*s* of the lower support part 110 and the valley 170.

By forming the upper surface 150*s* of the lower sidewall part 150 to have a level higher than a level of the lower support surface 110*s* of the lower support part 110, position deviation of the bending target may be reduced or prevented using the lower sidewall part 150. For example, the lower sidewall part 150 may guide a position of the bending target in the first direction DR1 and the second direction DR2 to prevent or reduce the extent of the position deviation of the bending target.

The lower mold 100 may include a material having excellent rigidity and strength and excellent thermal conductivity. In an embodiment, the lower mold 100 may include a graphite material, but a different material may be used in other embodiments.

A coefficient of thermal expansion of the lower mold 100 may be different from a coefficient of thermal expansion of the window member WM', which is the manufacturing target. In an embodiment, the coefficient of thermal expansion of the lower mold 100 may be in a first predetermined range (e.g., about $80\times10^{-7}/°$ C. to about $90\times10^{-7}/°$ C.), and the coefficient of thermal expansion of the window member WM' may be in a second predetermined range (e.g., about $70\times10^{-7}/°$ C. to about $80\times10^{-7}/°$ C.) different from the first predetermined range. For example, by making the coefficient of thermal expansion of the lower mold 100 greater than the coefficient of thermal expansion of the window member WM' (which is the manufacturing target), damage to the lower mold 100 due to thermal deformation of the window member WM' may be reduced or minimized. Accordingly, breakage, buckling, and/or burr phenomena, that may occur in the window member WM bent after being manufactured, may be reduced or minimized.

A shape of the lower bending molding part 130 will be described in more detail with reference to FIG. 12. The lower bending molding part 130 may include an upper area UA_130, a middle area MA_130, and a lower area LA_130. The upper area UA_130 may be adjacent to the lower support part 110. The upper area UA_130 may be in direct or indirect contact with the lower support part 110. The middle area MA_130 may be adjacent to the upper area UA_130. The middle area MA_130 may be positioned on a side opposite to the lower support part 110, with the upper area UA_130 interposed therebetween. The lower area LA_130 may be adjacent to the middle area MA_130. The lower area LA_130 may be positioned on a side opposite to the upper area UA_130, with the middle area MA_130 interposed therebetween.

In some embodiments, a radius of curvature Rb1 of an upper surface MA_130*s* of the middle area MA_130 may be different from (e.g., greater than) each of a radius of curvature Rb2 of an upper surface LA_130*s* of the lower area LA_130 and a radius of curvature Rb3 of an upper surface UA_130*s* of the upper area UA_130. A curvature of the upper surface MA_130*s* of the middle area MA_130 may be different from (e.g., less than) each of a curvature of the upper surface LA_130*s* of the lower area LA_130 and a curvature of the upper surface UA_130*s* of the upper area UA_130. It has been illustrated in FIG. 12 that the curvature of the upper surface UA_130*s* of the upper area UA_130 and the curvature of the upper surface LA_130*s* of the lower area LA_130 are the same as each other, but these curvatures may be different from one another in other embodiments.

The center of curvature Cb1 of the upper surface MA_130*s* of the middle area MA_130 may be different from the centers of curvature Cb2 of the upper surfaces UA_130*s* and LA_130*s* of the upper area UA_130 and the lower area LA_130. It has been illustrated in FIG. 12 that the centers of curvature of the upper surface UA_130*s* of the upper area UA_130 and the upper surface LA_130*s* of the lower area LA_130 are the same as each other, but these centers of curvature may be different in other embodiments.

The lower bending molding part 130 may further include a margin area MRG_130. The margin area MRG_130 may be disposed below the lower area LA_130. A sidewall MRG_130*t* of the margin area MRG_130 may include a surface perpendicular to the valley 170 of the lower mold 100. For example, the sidewall MRG_130*t* of the margin area MRG_130 may be a flat surface substantially parallel to the third direction DR3. The valley 170 may be formed in the lower bending molding part 130 by the margin area MRG_130. Accordingly, as described above, it is possible to reduce or prevent damage to the manufacturing target by securing the process margin.

In a virtual circular coordinate system, the center of curvature Cb2 of the upper surface LA_130*s* of the lower area LA_130 and the upper surface UA_130*s* of the upper area UA_130 may serve as the origin. In this case, an extension line of a boundary between the lower area LA_130 and the margin area MRG_130 may be referred to as a first mold axis Ax2. Given these features, an angle formed by a boundary between the lower area LA_130 and the middle area MA_130 and the first mold axis Ax2 may be a first mold angle θb1, an angle formed by a boundary between the middle area MA_130 and the upper area UA_130 and the boundary between the lower area LA_130 and the middle area MA_130 may be a second mold angle θb2, and an angle formed by a boundary between the upper area UA_130 and the lower support part 110 and the boundary between the middle area MA_130 and the upper area UA_130 may be a third mold angle θb3. In an embodiment, the sum of the first to third mold angles θb1, θb2, and θb3 may be 90°, but this sum may be different in another embodiment.

The second mold angle θb2 may be different from (e.g., greater than) each of the first mold angle θb1 and the third mold angle θb3. As an example, the second mold angle θb2 may be a predetermined number of (e.g., about 3 to 5) times each of the first mold angle θb1 and the third mold angle θb3.

Figure 15:
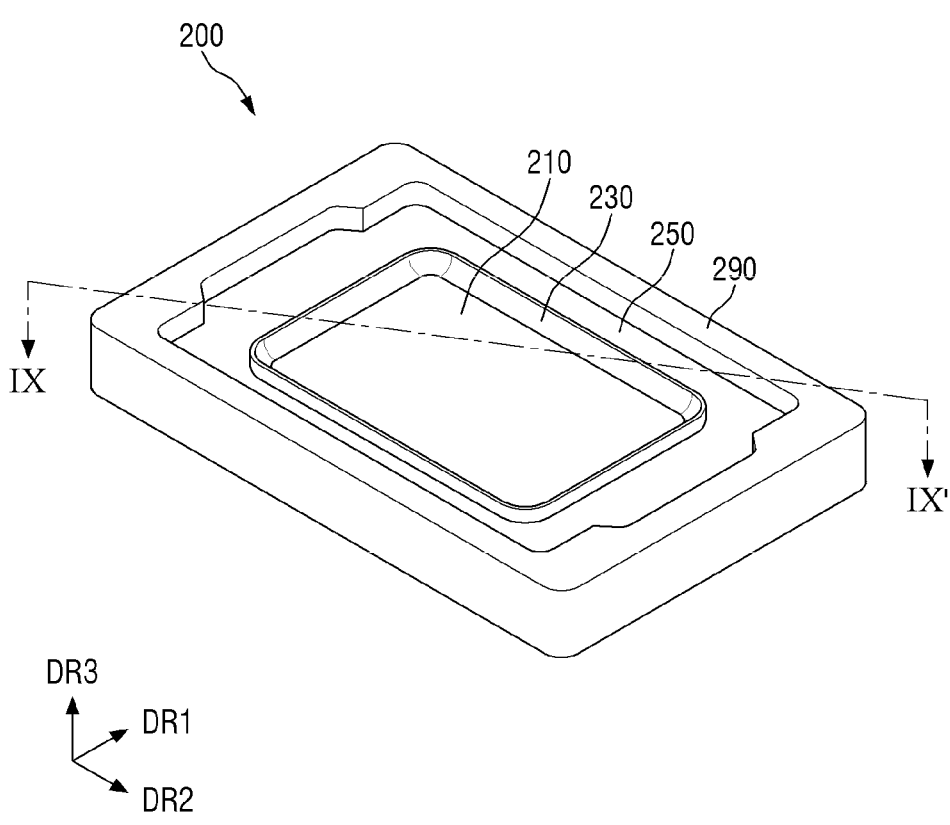
FIG. 15 is a perspective view of an upper mold according to an embodiment.
Figure 16:
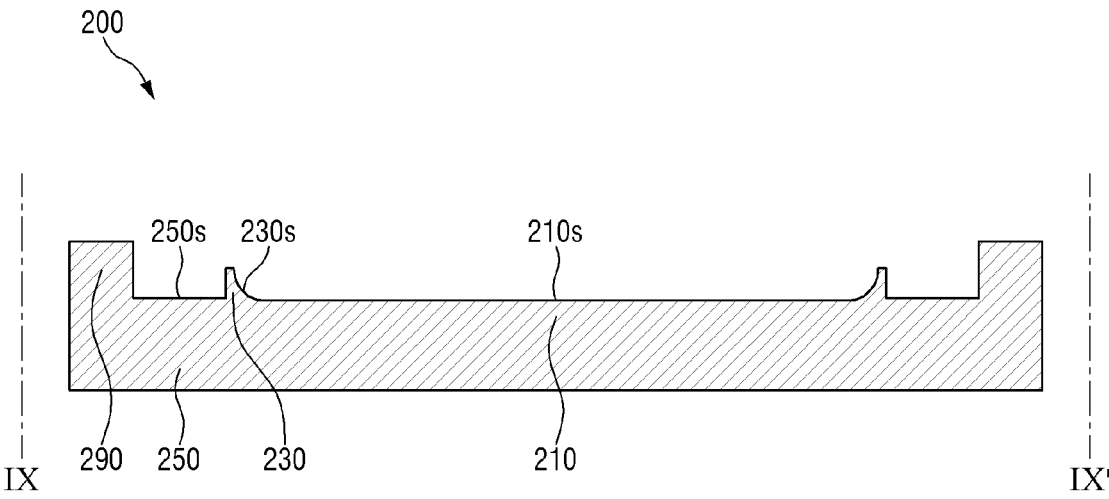
FIG. 16 is a cross-sectional view of the upper mold taken along line IX-IX' (e.g., diagonal line) of FIG. 15.

An upper mold will be described in more detail with reference to FIGS. 15 and 16. FIG. 15 is a perspective view of an upper mold according to an embodiment. FIG. 16 is a cross-sectional view of the upper mold taken along line IX-IX' (diagonal line) of FIG. 15.

Referring to FIGS. 15 and 16, the upper mold 200 may be disposed to overlap and face the lower mold 100 in the third direction DR3. The upper mold 200 may be configured so that a distance from the lower mold 100 may be adjusted. For example, when a position of the lower mold 100 is fixed, the upper mold 200 may be configured to be raised and lowered by a lifting unit.

The upper mold 200 may be at least partially in close contact with the window WM' (e.g., see FIG. 20) before being molded, which is the manufacturing target, in the bending process by forming the upper mold surface.

In an embodiment, the upper mold 200 may include an upper support part 210, an upper bending molding part 230, a sidewall insertion part 250, and an upper sidewall part 290. The upper support part 210 may include an upper support surface 210s on an upper surface thereof. A shape of the upper support surface 210s may substantially correspond to a shape of the upper surface of the main part TA0 of the window member WM (e.g., see FIG. 4) bent after being manufactured. In an embodiment, the upper support surface 210s may be a surface that is substantially flat. However, the present disclosure is not limited thereto. In one embodiment, the upper support surface 210s may include a curved surface having a curvature in at least a partial area thereof.

In a state in which the lower mold 100 and the upper mold 200 are coupled to each other, the upper support part 210 may approximately overlap the lower support part 110 in the third direction DR3. The upper support part 210 may stably support and fix the bending target in the bending process together with the lower support part 110.

The upper bending molding part 230 may be positioned to surround the upper support part 210. The upper bending molding part 230 may be formed adjacent to respective sides of the upper support part 210 in the first direction DR1 and the second direction DR2 and may be integrally formed without a physical boundary. The upper bending molding part 230, adjacent to respective sides of the upper support part 210 in the first direction DR1, may have a shape which extends in the second direction DR2. The upper bending molding part 230, adjacent to respective sides of the upper support part 210 in the second direction DR2, may have a shape which extends in the first direction DR1.

The upper bending molding part 230 may include an upper molding surface 230s curved or rounded in the third direction DR3 from the upper support part 210. The upper molding surface 230s may have an upward inclination in the drawings from the upper support part 210, that extends towards a sidewall insertion part 250 in a manner to be described later.

The upper bending molding part 230 may be a part that causes a shape deformation of the manufacturing target in the bending process. In some embodiments, a shape of the upper molding surface 230s may substantially correspond to a shape of each of the upper surfaces of the first to fourth side parts TA1, TA2, TA3, and TA4 and the first to fourth corner parts ETA1, ETA2, ETA3, and ETA4 of the window member WM (e.g., see FIG. 4) bent after being manufactured.

The sidewall insertion part 250 may be positioned to surround the upper bending molding part 230. The sidewall insertion part 250 may be formed adjacent to respective sides of the upper bending molding part 230 in the first direction DR1 and the second direction DR2 and may be integrally formed without a physical boundary. The sidewall insertion part 250, adjacent to respective sides of the upper bending molding part 230 in the first direction DR1, may have a shape which extends in the second direction DR2. The sidewall insertion part 250, adjacent to respective sides of the upper bending molding part 230 in the second direction DR2, may have a shape which extends in the first direction DR1.

The sidewall insert part 250 may have a surface 250s that is substantially flat. Levels of the upper support surface 210s of the upper support part 210 and the surface 250s of the sidewall insertion part 250 may be different from each other, but are not limited thereto.

Figure 17:
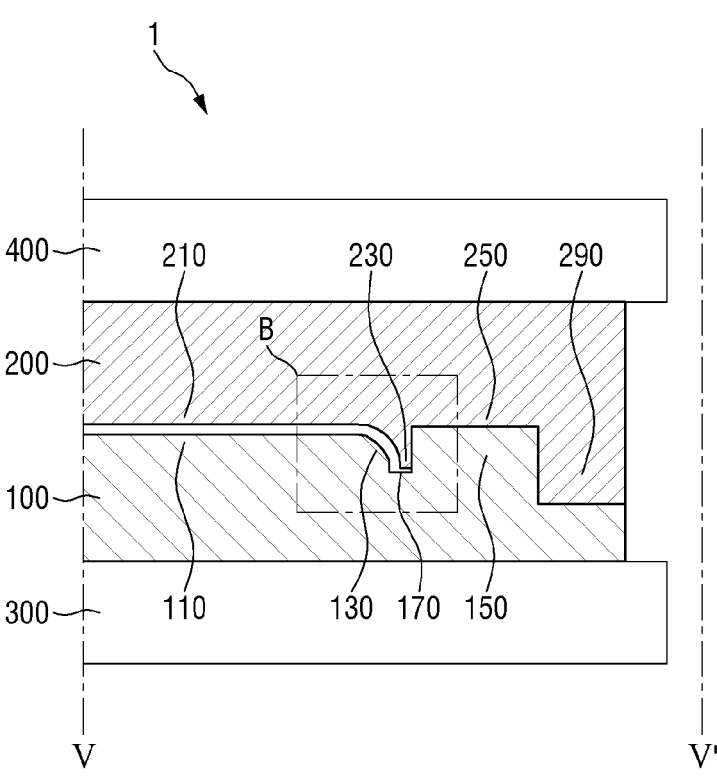
FIG. 17 is a cross-sectional view taken along line V-V' of FIG. 8 in a state in which the upper mold and the lower mold are coupled to each other.

The sidewall insertion part 250 may be a part into which the lower sidewall part 150 is inserted. Referring to FIG. 17 for convenience of explanation, in the state in which the lower mold 100 and the upper mold 200 are coupled to each other, the sidewall insertion part 250 may approximately overlap the lower sidewall part 150 in the third direction DR3. The lower sidewall part 150 of the lower mold 100 may be positioned between the upper bending molding part 230 and the upper sidewall part 290 of the upper mold 200.

The upper sidewall part 290 may be positioned to surround the sidewall insertion part 250. The upper sidewall part 290 may be formed adjacent to respective sides of the sidewall insertion part 250 in the first direction DR1 and the second direction DR2 and may be integrally formed without a physical boundary. The upper sidewall part 290, adjacent to respective sides of the sidewall insertion part 250 in the first direction DR1, may have a shape which extends in the second direction DR2. The upper sidewall part 290, adjacent to respective sides of the sidewall insertion part 250 in the second direction DR2, may have a shape which extends in the first direction DR1.

The upper sidewall part 290 may have a shape which protrudes beyond the upper support surface 210s of the upper support part 210 and the surface 250s of the sidewall insertion part 250. For example, the upper mold 200 may have an internal space surrounded by the upper sidewall part 290. In a state in which the upper mold 200 and the lower mold 100 are coupled to each other, the lower support part 110, the lower bending molding part 130, and the lower sidewall part 150 of the lower mold 100 described above may be at least partially inserted into the internal space. In an embodiment, the upper sidewall part 290 may at least partially surround the lower sidewall part 150.

The upper mold 200 may include a material having excellent rigidity and strength and excellent thermal conductivity, similar to the lower mold 100. In an embodiment, the upper mold 200 may include a graphite material but may include a different material in other embodiments.

The upper mold 200 may have a coefficient of thermal expansion different from (e.g., greater than) the coefficient of thermal expansion of the window member WM', which is the manufacturing target, similar to the lower mold 100. In an embodiment, the coefficient of thermal expansion of the upper mold 200 may be in a predetermined range, e.g., about $80 \times 10^{-7}/°$ C. to about $90 \times 10^{-7}/°$ C. As described above, by making the coefficient of thermal expansion of the upper mold 200 greater than the coefficient of thermal expansion of the window member WM', which is the manufacturing target, damage to the upper mold 200 due to thermal deformation of the window member WM' may be reduced or minimized. Accordingly, breakage, buckling, and/or burr phenomena that may otherwise occur in the window member WM bent after being manufactured may be reduced or minimized.

An embodiment of the structure of the apparatus for manufacturing a window member in a state in which the upper mold and the lower mold are coupled to each other will be described in detail with reference to FIGS. 17 and 18.

FIG. 17 is a cross-sectional view taken along line V-V' of FIG. 8 in a state in which the upper mold and the lower mold are coupled to each other. FIG. 18 is an enlarged view of portion 'B' of FIG. 17.

Figure 18:
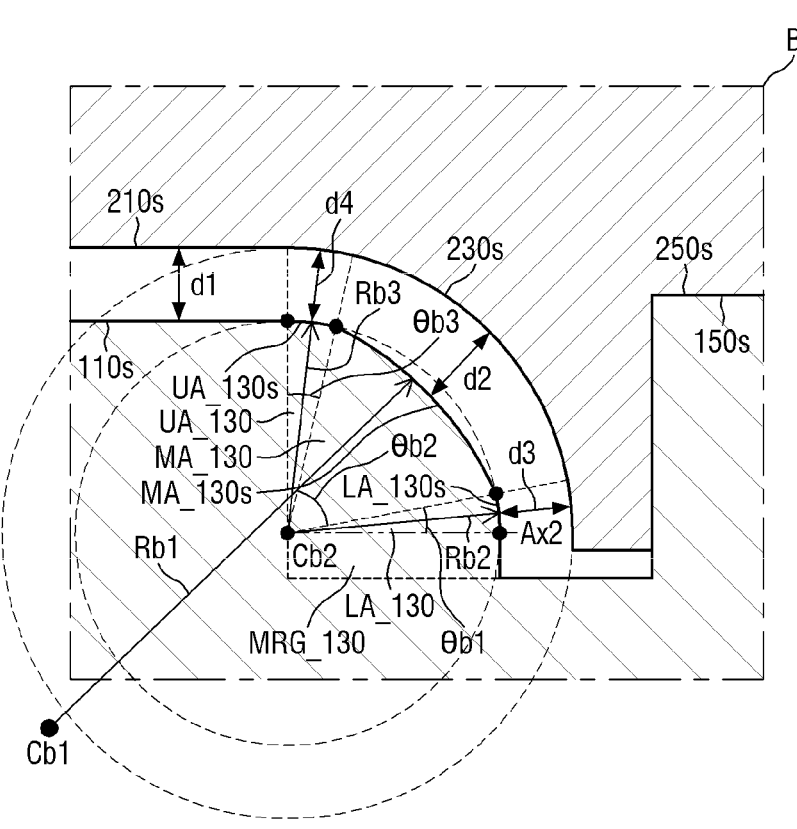
FIG. 18 is an enlarged view of portion 13' of FIG. 17.

Referring to FIGS. 17 and 18, in the state in which the lower mold 100 and the upper mold 200 are coupled to each other, the upper support part 210 may approximately overlap the lower support part 110 in the third direction DR3. The upper bending molding part 230 may approximately overlap portions of the lower bending molding part 130 and the valley 170 in the third direction DR3. The sidewall insertion part 250 may approximately overlap the lower sidewall part 150 in the third direction DR3. The upper sidewall part 290 may surround the lower support part 110, the lower bending molding part 130, and the lower sidewall part 150 of the lower mold 100 in a plan view.

The lower support part 110 of the lower mold 100 and the upper support part 210 of the upper mold 200 may be spaced apart from each other in the third direction DR3. The lower bending molding part 130 of the lower mold 100 and the upper bending molding part 230 of the upper mold 200 may be spaced apart from each other. The upper surface 150s of the lower sidewall part 150 of the lower mold 100 may be in direct or indirect contact with the surface 250s of the sidewall insertion part 250 of the upper mold 200.

The manufacturing target having a predetermined thickness may be interposed between the lower support part 110 and the upper support part 210 and between the lower bending molding part 130 and the upper bending molding part 230. When the manufacturing target is in close contact with the lower mold 100 and the upper mold 200, the lower sidewall part 150 inserted into the sidewall insertion part 250 may function as a close contact stopper. Accordingly, it is possible to reduce the likelihood of or prevent the manufacturing target from being damaged, and to reduce or minimize an assembly tolerance between the lower mold 100 and the upper mold 200.

As described above with reference to FIG. 12, the curvature of the upper surface MA_130s of the middle area MA_130 of the lower mold 100 may be less than the curvature of the upper surface LA_130s of the lower area LA_130 and the curvature of the upper surface UA_130s of the upper area UA_130 of the lower mold 100. In addition, the center of curvature Cb1 of the upper surface MA_130s of the middle area MA_130 may be at a different location from the centers of curvature Cb2 of the upper surface LA_130s of the lower area LA_130 and the upper surface UA_130s of the upper area UA_130. Referring to FIGS. 17 and 18 again, the upper surface LA_130s of the lower area LA_130 and the upper surface UA_130s of the upper area UA_130 may have the same center of curvature Cb2 as the center of curvature of the upper molding surface 230s of the upper bending molding part 230.

The lower support part 110 and the upper support part 210 may be spaced apart from each other by a first maximum distance d1. The middle area MA_130 and the upper bending molding part 230 may be spaced apart from each other by a second maximum distance d2. The lower area LA_130 and the upper bending molding part 230 may be spaced apart from each other by a third maximum distance d3. The upper area UA_130 and the upper bending molding part 230 may be spaced apart from each other by a fourth maximum distance d4.

In an embodiment, a distance between the lower support part 110 and the upper support part 210 may be constant as the first maximum distance d1. A distance between the lower area LA_130 and the upper bending molding part 230 may be constant as the third maximum distance d3. A distance between the upper area UA_130 and the upper bending molding part 230 may be constant as the fourth maximum distance d4. A distance between the middle area MA_130 and the upper bending molding part 230 may increase from the upper area UA_130 and the lower area LA_130 adjacent to the middle area MA_130 toward a middle portion of the middle area MA_130. For example, the distance between the middle area MA_130 and the upper bending molding part 230 may have the second maximum distance d2 from the middle portion.

In one embodiment, distance may refer to the shortest distance from any one point of an upper surface of the lower mold 100 to any one point of a lower surface of the upper mold 200, and the maximum distance refers to the greatest distance of distances.

The second maximum distance d2 may be different from (e.g., greater than) each of the third maximum distance d3 and the fourth maximum distance d4. The second maximum distance d2 may be different from (e.g., greater than) each of the third and fourth maximum distances d3 and d4. Thus, breakage and/or buckling phenomena of the first to fourth corner parts ETA1, ETA2, ETA3, and ETA4 of the window member WM (e.g., see FIG. 4) bent after being manufactured may be reduced or prevented.

In some embodiments, the second maximum distance d2 may be greater than each of the third and fourth maximum distances d3 and d4 by a predetermined amount, e.g., about 0.04 to about 0.2 times each f the third and fourth maximum distances d3 and d4. As an example, the second maximum distance d2 may be greater than each of the third and fourth maximum distances d3 and d4 by about 0.02 mm or more and about 0.1 mm or less.

When the difference between the second maximum distance d2 and each of the third and fourth maximum distances d3 and d4 is greater than or equal to a predetermined amount (e.g., about 0.04 times each of the third and fourth maximum distances d3 and d4), the breakage and/or buckling phenomena of the first to fourth corner parts ETA1, ETA2, ETA3, and ETA4 may be reduced or prevented. When the difference is less than or equal to 0.2 times each of the third and fourth maximum distances d3 and d4, the shape of the window member WM does not collapse and a desired shape of the window member WM may be obtained, in a manufacturing process of a window member WM to be described later.

In one embodiment, the third maximum distance d3 and the fourth maximum distance d4 may be substantially the same as the first maximum distance d1. Here, the phrase "substantially the same" may refer to a case where a difference between each of the third and fourth maximum distances d3 and d4 and the first maximum distance d1 is less than or equal to 0.01 times the first maximum distance d1. The third and fourth maximum distances d3 and d4 may be the same as the first maximum distance d1. Thus, it is possible to prevent burr from occurring at ends of the first to fourth corner parts ETA1, ETA2, ETA3, and ETA4 of the window member WM (e.g., see FIG. 4) bent after being manufactured.

Hereinafter, a method for manufacturing a window member will be described with reference to FIGS. 19 to 28.

Figure 19:
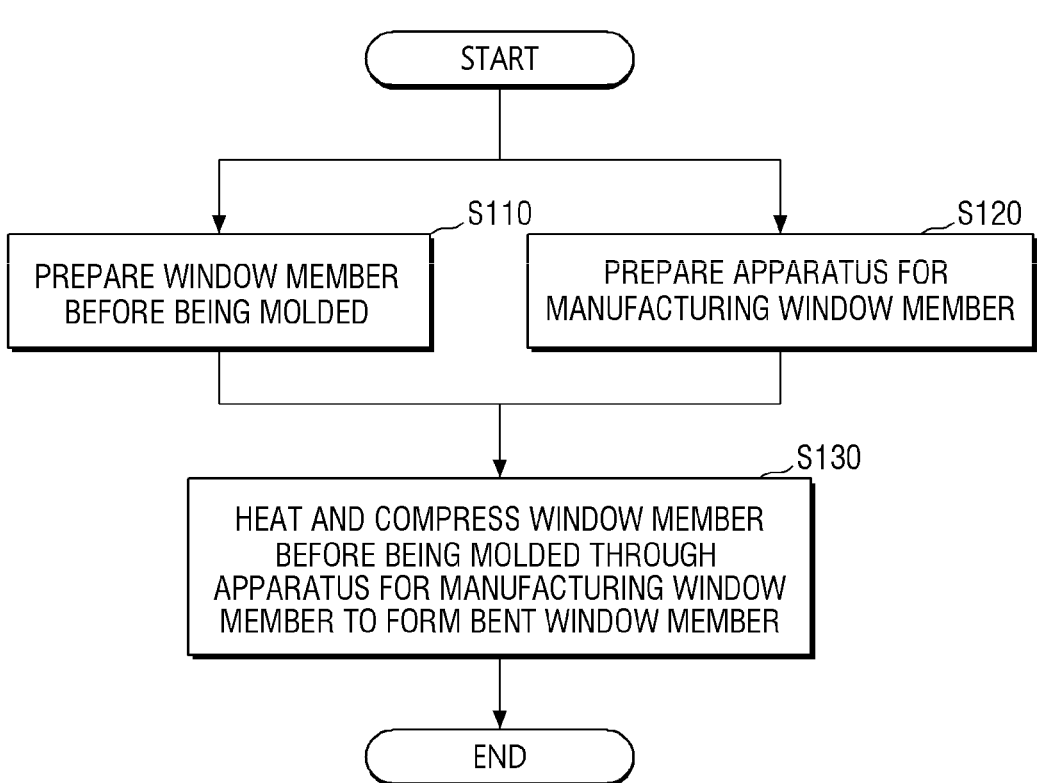
FIG. 19 is a flowchart illustrating a method for manufacturing a window member according to an embodiment.

FIG. 19 is a flowchart illustrating a method for manufacturing a window member according to an embodiment.

Referring to FIG. 19, the method for manufacturing a window member according to an embodiment may include an operation of preparing a window member before being molded (S110), an operation of preparing an apparatus for manufacturing a window member (S120), and an operation of heating and compressing the window member before being molded through the apparatus for manufacturing a window member to form a bent window member (S130).

Figure 20:
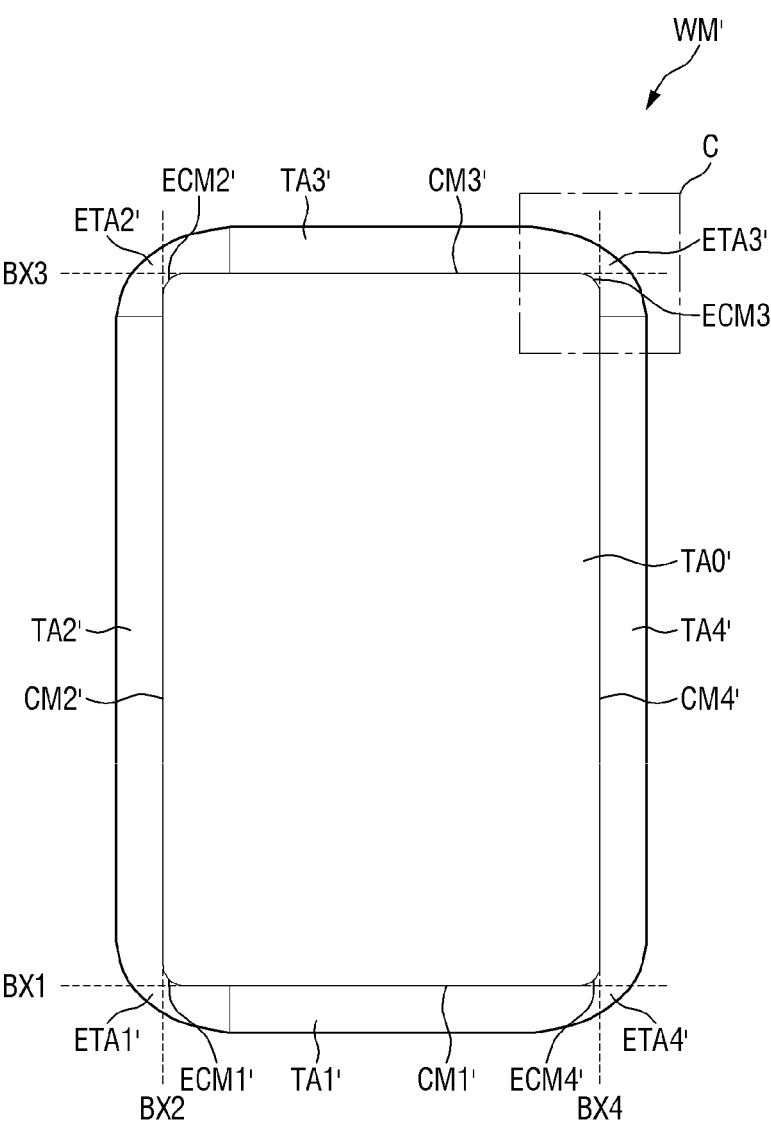
FIG. 20 is a plan view of the window member before being molded according to an embodiment.
Figure 21:
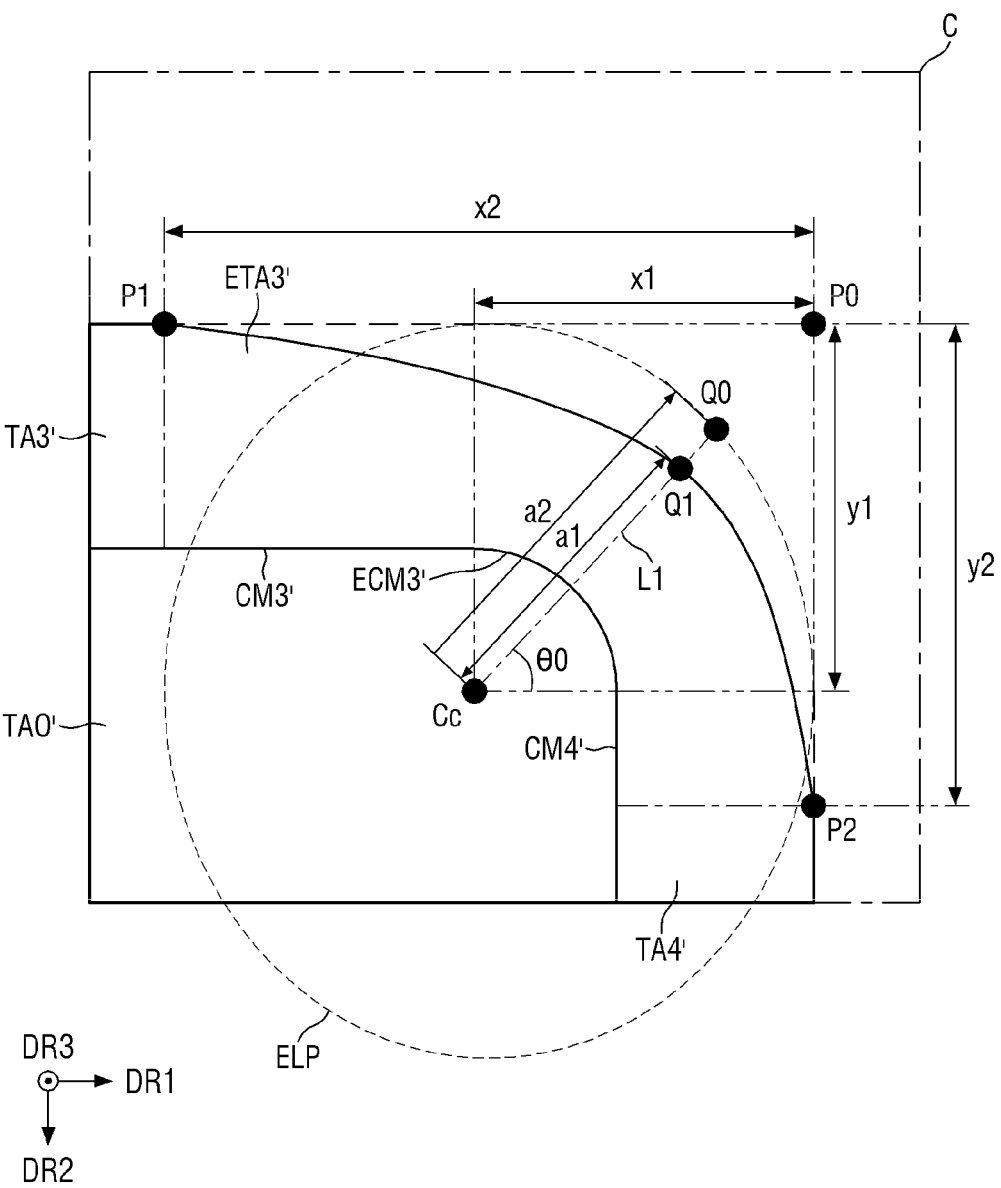
FIG. 21 is an enlarged view of area 'C' of FIG. 20.

FIG. 20 is a plan view of the window member before being molded according to an embodiment. FIG. 21 is an enlarged view of area 'C' of FIG. 20.

Referring to FIGS. 20 and 21, the operation of preparing the window member WM' before being molded (S110) may include an operation of preparing the window member WM' before being molded, having a plate shape that does not have a bent surface. The window member WM' before being molded may refer to a window member having a flat form before being bent. In an embodiment, the window member WM' before being molded, glass prepared in operation S110 may be in a state in which both front and rear surfaces thereof are flat, but is not limited thereto.

In some embodiments, the operation of preparing the window member WM' before being molded (S110) may include an operation of preparing a mother window and an operation of partially trimming the mother window. The operation of partially trimming the mother window may include an operation of partially removing or grinding the vicinity of a vertex of the mother window to process the mother window in a round shape in a plan view.

The window member WM' before being molded may include a main part TA0', first to fourth side parts TA1', TA2', TA3', and TA4', and first to fourth corner parts ETA1', ETA2', ETA3', and ETA4'. The main part TA0' of the window member WM' before being molded may be parallel to a plane extending in the first direction DR1 and the second direction DR2. The main part TA0' may include a first side CM1' extending in a direction parallel to the first direction DR1, a second side CM2' crossing the first side CM1' and extending in a direction parallel to the second direction DR2, a third side CM3' crossing the second side CM2' and extending in the direction parallel to the first direction DR1, and a fourth side CM4' crossing the third side CM3' and extending in the direction parallel to the second direction DR2. The first side CM1' may be parallel to the third side CM3'. The second side CM2' may be parallel to the fourth side CM4'.

In addition, the main part TA0' may further include a first corner side ECM1' connecting the first side CM1' and the second side CM2' to each other, a second corner side ECM2' connecting the second side CM2' and the third side CM3' to each other, a third corner side ECM3' connecting the third side CM3' and the fourth side CM4' to each other, and a fourth corner side ECM4' connecting the fourth side CM4' and the first side CM1' to each other.

The first side part TA1' of the window member WM' before being molded may be adjacent to the first side CM1' in the second direction DR2. The second side part TA2' may be adjacent to the second side CM2' in the first direction DR1. The third side part TA3' may be adjacent to the third side CM3' in the second direction DR2. The third side part TA3' may be spaced apart from the first side part TA1' in the second direction DR2, with the main part TA0' interposed therebetween. The fourth side part TA4' may be adjacent to the fourth side CM4' in the first direction DR1. The fourth side part TA4' may be spaced apart from the second side part TA2' in the first direction DR1, with the main part TA0' interposed therebetween.

The first corner part ETA1' of the window member WM' before being molded may be adjacent to the first side part TA1' and the second side part TA2'. The first corner part ETA1' may connect the first side part TA1' and the second side part TA2' to each other, and may be disposed between the first side part TA1' and the second side part TA2'. An edge of the first corner part ETA1' may have a convex shape in a plan view, but may have a different shape in another embodiment.

The second corner part ETA2' may be adjacent to the second side part TA2' and the third side part TA3'. The second corner part ETA2' may connect the second side part TA2' and the third side part TA3' to each other, and may be disposed between the second side part TA2' and the third side part TA3'. An edge of the second corner part ETA2' may have a convex shape in a plan view, but may have a different shape in another embodiment.

The third corner part ETA3' may be adjacent to the third side part TA3' and the fourth side part TA4'. The third corner part ETA3' may connect the third side part TA3' and the fourth side part TA4' to each other, and may be disposed between the third side part TA3' and the fourth side part TA4'. An edge of the third corner part ETA3' may have a convex shape in plan view, but may have a different shape in another embodiment.

The fourth corner part ETA4' may be adjacent to the fourth side part TA4' and the first side part TA1'. The fourth corner part ETA4' may connect the fourth side part TA4' and the first side part TA1' to each other, and may be disposed between the fourth side part TA4' and the first side part TA1'. An edge of the fourth corner part ETA4' may have a convex shape in plan view, but may have a different shape in another embodiment.

A first bending axis BX1 may overlap a boundary between the main part TA0' and the first side part TA1' in a plan view. The first bending axis BX1 may extend in the first direction DR1. A second bending axis BX2 may overlap a boundary between the main part TA0' and the second side part TA2' in a plan view. The second bending axis BX2 may extend in the second direction DR2. A third bending axis BX3 may overlap a boundary between the main part TA0' and the third side part TA3' in a plan view. The third bending axis BX3 may extend in the first direction DR1. A fourth bending axis BX4 may overlap a boundary between the main part TA0' and the fourth side part TA4' in a plan view. The fourth bending axis BX4 may extend in the second direction DR2.

The first corner part ETA1' may overlap a point at which the first bending axis BX1 and the second bending axis BX2 cross each other in a plan view. The second corner part ETA2' may overlap a point at which the second bending axis BX2 and the third bending axis BX3 cross each other in a plan view. The third corner part ETA3' may overlap a point at which the first bending axis BX1 and the fourth bending axis BX4 cross each other in a plan view. The fourth corner part ETA4' may overlap a point at which the third bending axis BX3 and the fourth bending axis BX4 cross each other in a plan view.

The first side part TA1' may be bent from the main part TA0' on the basis of the first bending axis BX1. The first side part TA1' may be bent to have a predetermined curvature. The second side part TA2' may be bent from the main part TA0' on the basis of the second bending axis BX2. The second side part TA2' may be bent to have a predetermined curvature. The third side part TA3' may be bent from the main part TA0' on the basis of the third bending axis BX3. The third side part TA3' may be bent to have a predetermined curvature. The fourth side part TA4' may be bent from the main part TA0' on the basis of the first bending axis BX1. The fourth side part TA4' may be bent to have a predetermined curvature.

The first corner part ETA1' may be bent from the main part TA0' on the basis of the first bending axis BX1 and the second bending axis BX2. The first corner part ETA1' may be bent to have a predetermined curvature. The second corner part ETA2' may be bent from the main part TA0' on the basis of the second bending axis BX2 and the third bending axis BX3. The second corner part ETA2' may be bent to have a predetermined curvature. The third corner part ETA3' may be bent from the main part TA0' on the basis of the third bending axis BX3 and the fourth bending axis BX4. The third corner part ETA3' may be bent to have a predetermined curvature. The fourth corner part ETA4' may be bent from the main part TA0' on the basis of the fourth bending axis BX4 and the first bending axis BX1. The fourth corner part ETA4' may be bent to have a predetermined curvature.

Embodiment of the shapes of the first to fourth corner parts ETA1', ETA2', ETA3', and ETA4' of the window member WM' before being molded will be described in more detail with reference to FIG. 21.

FIG. 21 illustrates the third corner part ETA3' as an example, but shapes of the first to fourth corner parts ETA1', ETA2', ETA3', and ETA4' may be determined in the same manner as contents to be described later. For example, each of the first corner part ETA1', the second corner part ETA2', and the fourth corner part ETA4' may have the same shape as a shape of the third corner part ETA3' symmetrical in the first direction DR1 and/or the second direction DR2. However, the present disclosure is not limited thereto, and the shapes of the first to fourth corner parts ETA1', ETA2', ETA3', and ETA4' may all be different from one another.

The window member WM' before being molded may include first to third points P1, P2, and Q1. In one embodiment, the third corner part ETA3' of the window member WM' before being molded may include a shape of a spline curve connecting the first to third points P1, P2, and Q1 to each other. The spline curve may refer to a smooth curve passing through a plurality of given control points. In an embodiment, the spline curve may be a portion of an elliptical shape or a circular shape, but the spline curve may have a different shape in another embodiment.

The first point P1 and the second point P2 may be determined on the basis of a first reference point P0, and the third point Q1 may be defined on the basis of a second reference point Q0. The first reference point P0 may be positioned at a point spaced apart from a reference center of curvature Cc (which is a center of curvature of the third corner side ECM3') to one side in the first direction DR1 by a first distance x1 and to one side in the second direction DR2 by a second distance y1.

The second reference point Q0 may be positioned on an ellipse ELP with the first distance x1 as a first radius, the second distance y1 as a second radius, and the reference center of curvature Cc as a center. The second reference point Q0 may be positioned at a point at which a reference line L1 passing through the reference center of curvature Cc and inclined by a reference angle θ0 of 45° with respect to the first direction DR1 meets the ellipse ELP.

The first point P1 may be positioned at a point spaced apart from the first reference point P0 to the other side in the first direction DR1 by a third distance x2. The first point P1 may overlap the third side CM3' in the second direction DR2. In an embodiment, the third distance x2 may be a predetermined number of (e.g., about 1.8 to about 2.2) times the first distance x1. When the third distance x2 is greater than or equal to 1.8 times the first distance x1, it is possible to reduce the likelihood or prevent breakage, buckling, and/or burr from occurring at first to fourth corner parts ETA1, ETA2, ETA3, and ETA4 of a window member WM (e.g., see FIGS. 28A and 28B) in a manufacturing process of a window member WM to be described later. When the third difference x2 is less than or equal to a predetermined amount (e.g., about 2.2 times the first distance x1), the shape of the window member WM does not collapse and a desired shape of the window member WM may be obtained, in a manufacturing process of a window member WM to be described later.

The second point P2 may be positioned at a point spaced apart from the first reference point P0 to the other side in the second direction DR2 by a fourth distance y2. The second point P2 may overlap the fourth side CM4' in the first direction DR1. In an embodiment, the fourth distance y2 may lie within a predetermined range, e.g., 1.2 to 1.4 times the second distance y1. When the fourth distance y2 is greater than or equal to 1.2 times the second distance y1, it is possible to prevent breakage, buckling, and/or burr from occurring at first to fourth corner parts ETA1, ETA2, ETA3, and ETA4 of a window member WM (e.g., see FIGS. 28A and 28B) in a manufacturing process of a window member WM to be described later. When the fourth distance y2 is less than or equal to 1.4 times the second distance y1, a shape of the window member WM does not collapse and a desired shape of the window member WM may be obtained, in a manufacturing process of a window member WM to be described later.

The third point Q1 may be positioned on the reference line L1. A first reference length a1, which is a distance on the reference line L1 from the reference center of curvature Cc to the third point Q1, may lie within a predetermined range, e.g., about 0.85 to about 0.95 times the second reference length a2, which is a distance on the reference line L1 from the reference center of curvature Cc to the second reference point Q0. When the first reference length a1 is greater than or equal to about 0.85 times the second reference length a2, a shape of the window member WM does not collapse and a desired shape of the window member WM may be obtained, in a manufacturing process of a window member WM to be described later. When the first reference length a1 is less than or equal to about 0.95 times the second reference length a2, it is possible to prevent breakage, buckling, and/or burr from occurring at first to fourth corner parts ETA1, ETA2, ETA3, and ETA4 of a window member WM (e.g., see FIGS. 28A and 28B) in a manufacturing process of a window member WM to be described later.

The operation of preparing the apparatus for manufacturing a window member (S120) may include an operation of preparing the lower mold 100, the upper mold 200, the lower heat source 300, and the upper heat source 400 as described above. The apparatus 1 for manufacturing a window member has been described above, and an redundant description thereof will thus be omitted.

Figure 22:
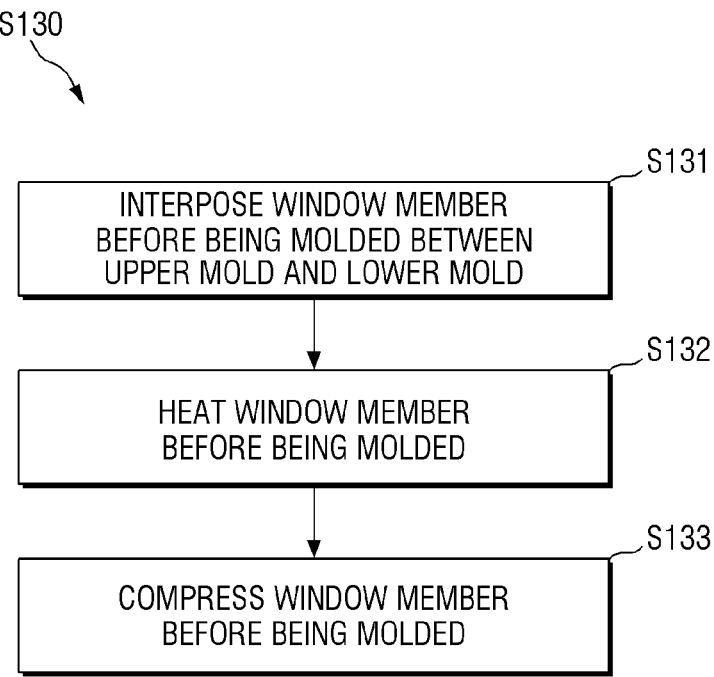
FIG. 22 is a flowchart illustrating an example of operation S130 of FIG. 19.
Figure 23:
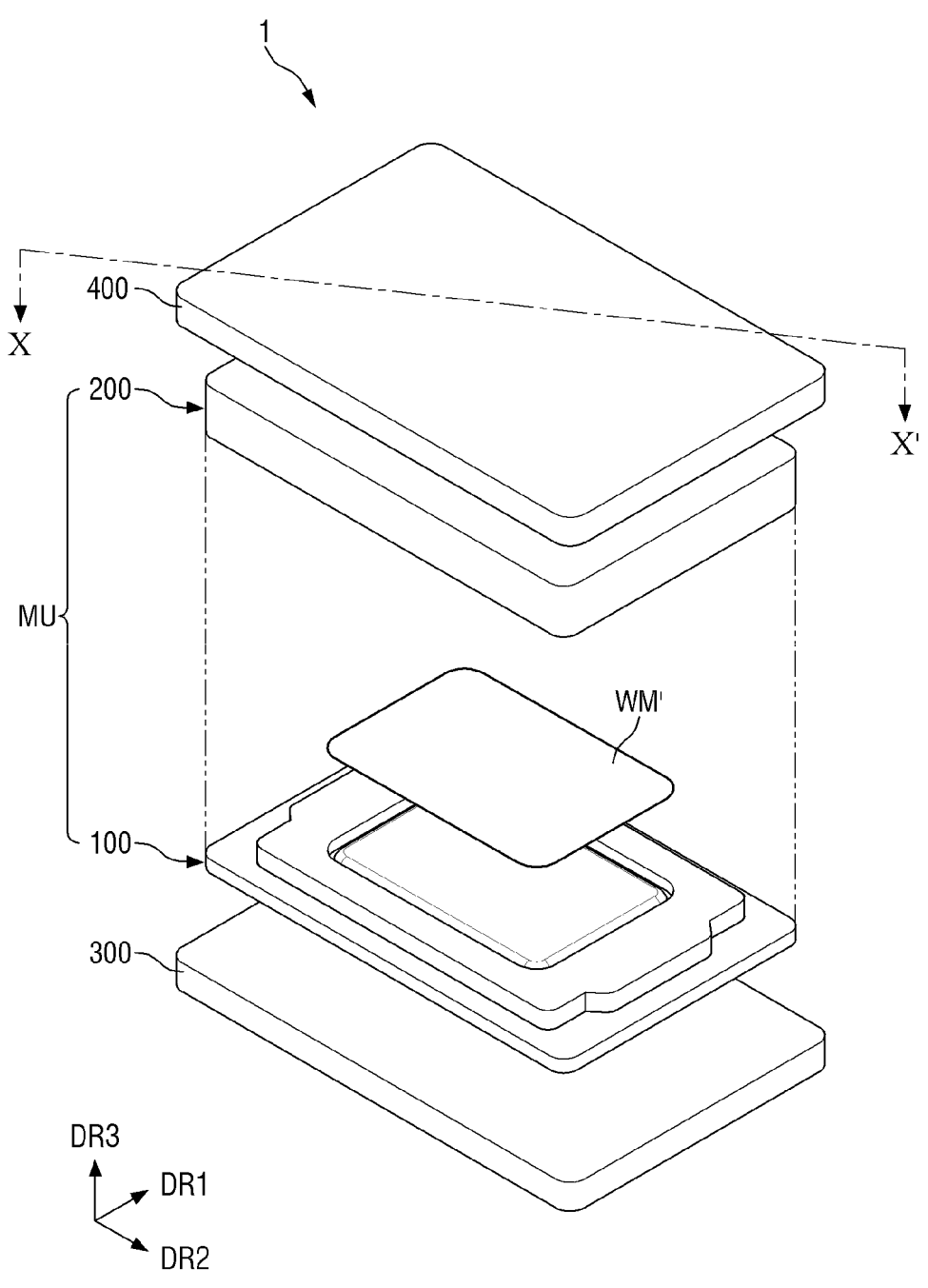
FIG. 23 is a perspective view illustrating an operation of interposing the window member before being molded, on a mold according to an embodiment.
Figure 24:
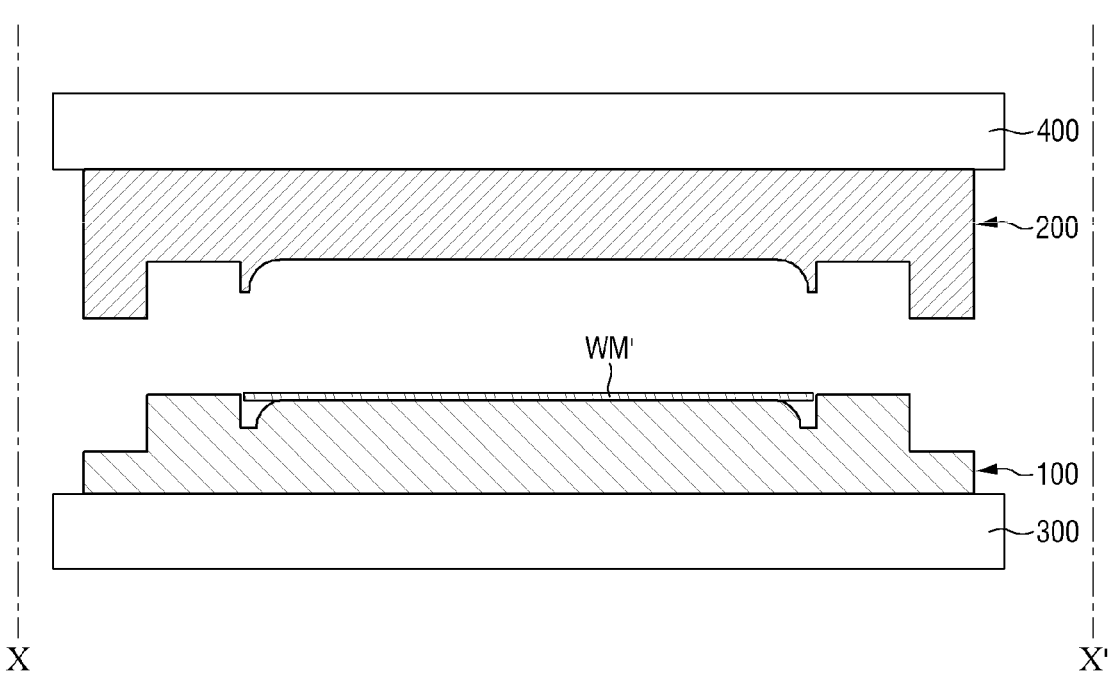
FIG. 24 is a cross-sectional view taken along line X-X' (e.g., diagonal line) of FIG. 23.
Figure 25:
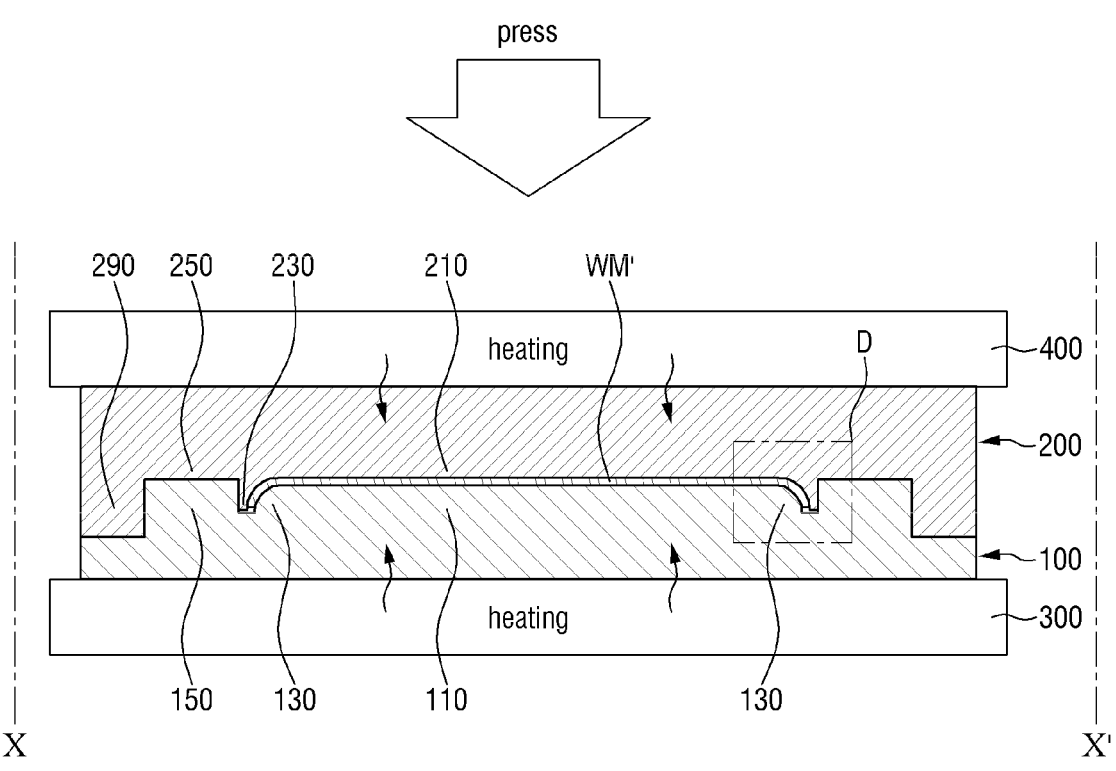
FIG. 25 is a cross-sectional view illustrating an operation of heating and compressing the window member before being molded according to an embodiment.
Figure 26:
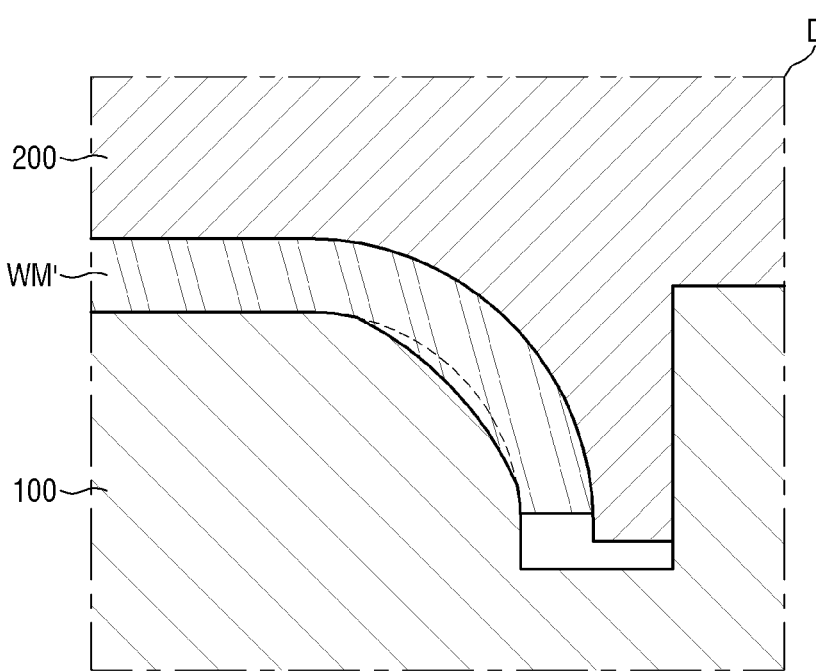
FIG. 26 is an enlarged view of portion 'D' of FIG. 25.
Figure 27:
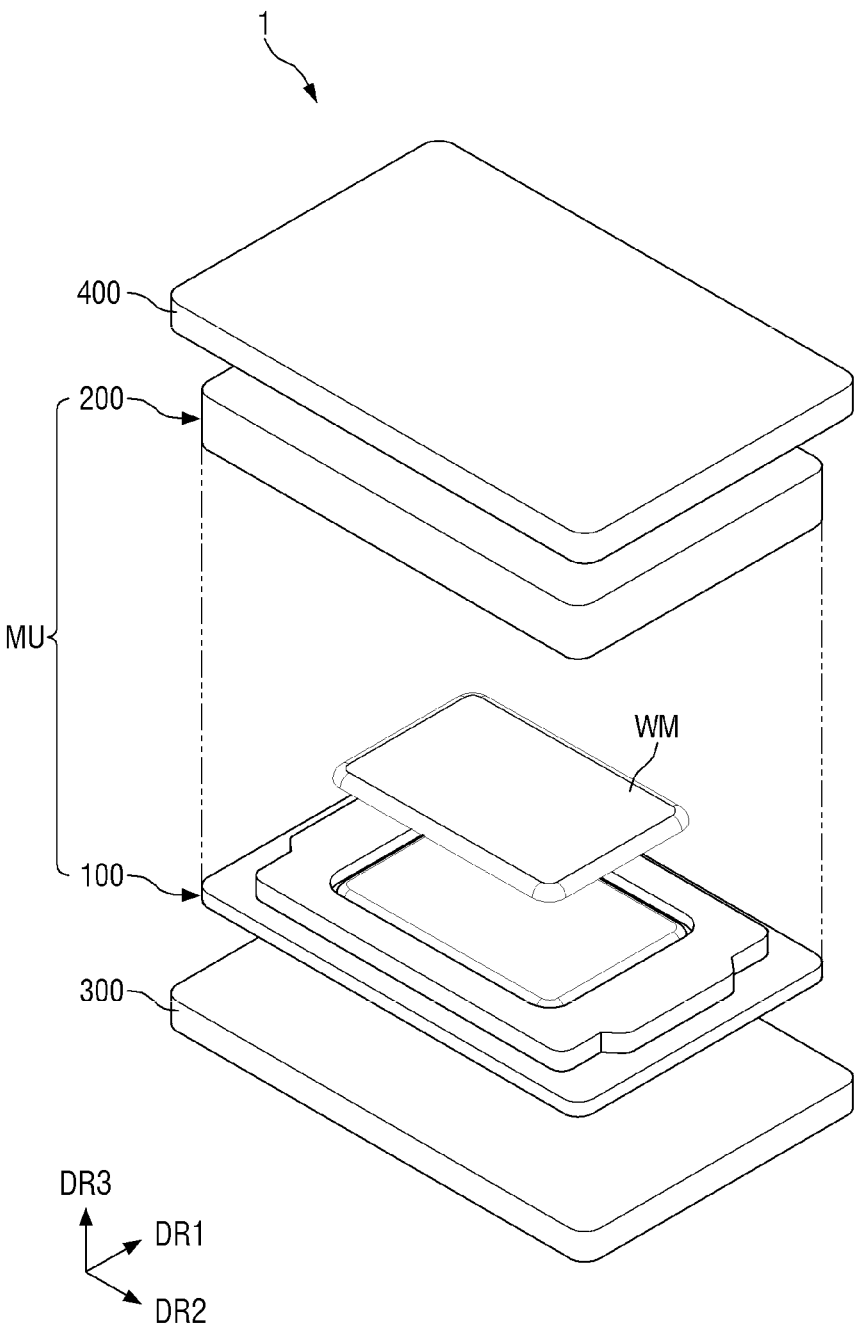
FIG. 27 is a perspective view illustrating a state of the window member after being manufactured according to an embodiment.

FIG. 22 is a flowchart illustrating an example of operation S130 of FIG. 19. FIG. 23 is a perspective view illustrating an operation of interposing the window member before being molded, on a mold according to an embodiment. FIG. 24 is a cross-sectional view taken along line X-X' (diagonal line) of FIG. 23. FIG. 25 is a cross-sectional view illustrating an operation of heating and compressing the window member before being molded according to an embodiment. FIG. 26 is an enlarged view of portion 'D' of FIG. 25. FIG. 27 is a perspective view illustrating a state of the window member after being manufactured according to an embodiment.

Referring to FIGS. 22 to 27, the operation of heating and compressing the window member WM', before being molded through the apparatus 1 for manufacturing a window member to form the bent window member (S130), may include an operation of interposing the window member before being molded between the upper mold and the lower mold (S131), and an operation of heating the window member before being molded (S132), and an operation of compressing the window member before being molded (S133).

The operation of interposing the window member WM' before being molded between the lower mold 100 and the upper mold 200 (S131) may include an operation of disposing the window member WM' before being molded directly on the lower mold 100 in a state in which the lower mold 100 and the upper mold 200 are spaced apart from each other by a predetermined distance. For example, the window member WM' before being molded may be put on the lower support part 110 of the lower mold 100, and may be disposed so that a position of the window member WM' before being molded is guided by the lower sidewall part 150. Side surfaces of the window member WM', before being molded in the first direction DR1 and the second direction DR2, may be in contact with or be spaced apart from side surfaces of the lower sidewall part 150 to prevent position deviation of the window member WM' before being molded.

The operation of heating the window member before being molded (S132) may be performed by the lower heat source 300 and the upper heat source 400. For example, when the lower heat source 300 and the upper heat source 400 include heating plates, respectively, the lower heat source 300 and the upper heat source 400 may be in contact with the lower mold 100 and the upper mold 200, respectively. Heat provided through the lower heat source 300 may be transferred to the window member WM' before being molded through the lower mold 100, and heat provided through the upper heat source 400 may be transferred to the window member WM' before being molded through the upper mold 200. In an embodiment, a heating temperature of the window member WM' before being molded may lie within a predetermined range, e.g., about 400° C. to about 800° C. or about 500° C. to about 700° C.

The operation of compressing the window member before being molded (S133) may include an operation of bringing the window member WM' being molded and the lower mold 100 into close contact with each other, and bringing the window member WM' before being molded and the upper mold 200 into close contact with each other, to partially bend the window member WM' before being molded. Before being molded, the window member WM' having flat front and rear surfaces may be bent and molded by the lower bending molding part 130 of the lower mold 100 and the upper bending molding part 230 of the upper mold 200, in a state in which it is stably supported and fixed by the lower support part 110 of the lower mold 100 and the upper support part 210 of the upper mold 200. When the lower bending molding part 130 and the upper bending molding part 230 have molding surfaces rounded in the third direction DR3, respectively, the window member WM' before being molded is at least partially bent in the third direction DR3, such that the bent window member WM may be formed.

In some embodiments, the operation of compressing the window member before being molded (S133) may be performed with lowering a temperature of the window member WM', while the window member WM' before being molded is changed from a flat state to a bent state. By performing compression using the lower mold surface of the lower mold 100 and the upper mold surface of the upper mold 200, while at the same time lowering the temperature of the window member WM' before being molded and heated in an operation of heating the window member WM' before being molded (S130), a shape corresponding to the mold surfaces of the lower mold 100 and the upper mold 200 may be completely formed.

Figure 28A:
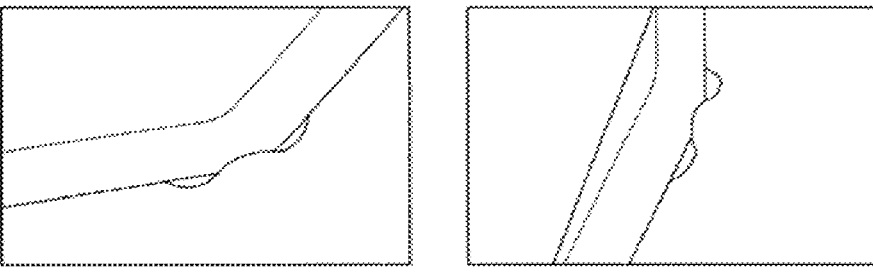
FIGS. 28A and 28B are views illustrating a state of the window member after being manufactured according to an embodiment together with a Comparative Example.
Figure 28B:
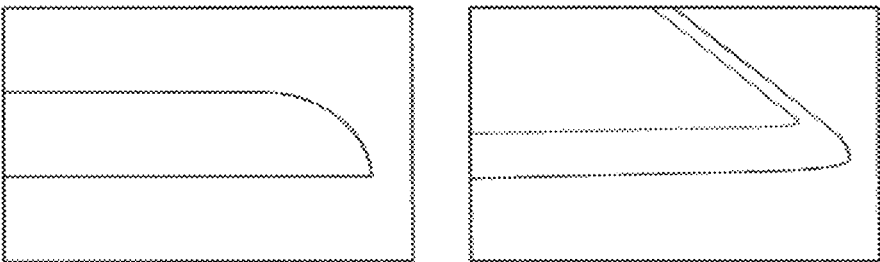

FIGS. 28A and 28B are views illustrating a state of the window member after being manufactured according to an embodiment together with Comparative Example. More specifically, referring to FIGS. 28A and 28B, FIG. 28A illustrates a state of a window member of the comparative example after being manufactured as Comparative Example, and FIG. 28B illustrates a window member WM' before being molded according to an embodiment and a state of the window member WM according to an embodiment of the present disclosure after being manufactured using the apparatus 1 for manufacturing a window member according to an embodiment.

In the case of the window member of FIG. 28A, it can be seen that burr occurs at one end of the window member. On the other hand, in the case of the window member WM according to an embodiment of FIG. 28B, it can be seen that one end of the window member WM is smoothly formed without burr.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation. The embodiments may be combined to form additional embodiments.

What is claimed is:
1. A window member comprising:
a main part including a first side extending in a first direction, a second side extending in a second direction different from the first direction, and a first corner side positioned between the first side and the second side;
a first side part in contact with the first side;
a second side part in contact with the second side; and
a first corner part positioned between the first side part and the second side part, wherein the first corner part includes:
a first upper corner part positioned adjacent to the main part;
a first middle corner part positioned adjacent to the first upper corner part; and
a first lower corner part positioned on a side opposite to the first upper corner part, with the first middle corner part interposed therebetween, and
a lower surface of the first middle corner part has a first radius of curvature, a lower surface of the first lower corner part has a second radius of curvature, and the first radius of curvature is greater than the second radius of curvature.
2. The window member of claim 1, wherein upper surfaces of the first upper corner part, the first middle corner part, and the first lower corner part have a same curvature.
3. The window member of claim 1, wherein:
the main part has a first maximum thickness,
the first middle corner part has a second maximum thickness, the first lower corner part has a third maximum thickness, and the second maximum thickness is greater than the third maximum thickness.

4. The window member of claim 3, wherein the second maximum thickness is greater than the third maximum thickness by about 0.04 to about 0.2 times the third maximum thickness.

5. The window member of claim 4, wherein the second maximum thickness is greater than the third maximum thickness by about 0.02 mm or more and about 0.1 mm or less.

6. The window member of claim 3, wherein the third maximum thickness is equal to the first maximum thickness.

7. The window member of claim 1, wherein a thickness of the first middle corner part increases from the first upper corner part and the first lower corner part toward a middle portion of the first middle corner part.

8. The window member of claim 1, wherein a first height from a lower surface of the main part to one end of the first corner part is equal to each of a second height from the lower surface of the main part to one end of the first side part and a third height from the lower surface of the main part to one end of the second side part.

9. A window for an electronic device, comprising:
a corner part; and
a main part configured to transmit light emitted by a display panel,
wherein the corner part is coupled to the main part and includes a first part having a first thickness and a second part having a second thickness, and wherein the first part is between the main part and the second part and the second thickness is greater than the first thickness.

10. The window of claim 9, wherein an exterior surface of the corner part is rounded.

11. The window of claim 10, wherein:
an interior surface of the first part has a first radius of curvature, and
an interior surface of the second part has a second radius of curvature different from the first radius of curvature.

12. The window of claim 11, wherein the second radius of curvature is greater than the first radius of curvature.

13. The window of claim 12, wherein the corner part includes a third part positioned between the second part and a case, an interior surface of the third part having a third radius of curvature different from the second radius of curvature.

14. The window of claim 13, wherein the first radius of curvature is equal to the third radius of curvature.

* * * * *